United States Patent
Eom et al.

(10) Patent No.: US 12,022,699 B2
(45) Date of Patent: Jun. 25, 2024

(54) DISPLAY DEVICE WITH ALTERNATING FAN-OUT LINES

(71) Applicant: SAMSUNG DISPLAY CO., LTD., Yongin-si (KR)

(72) Inventors: Tae Jong Eom, Cheonan-si (KR); Chun Gi You, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 227 days.

(21) Appl. No.: 17/189,561

(22) Filed: Mar. 2, 2021

(65) Prior Publication Data

US 2021/0399077 A1    Dec. 23, 2021

(30) Foreign Application Priority Data

Jun. 22, 2020 (KR) .................. 10-2020-0075494

(51) Int. Cl.
*H10K 59/131* (2023.01)
*H01L 23/00* (2006.01)
*H10K 59/121* (2023.01)

(52) U.S. Cl.
CPC ........... *H10K 59/131* (2023.02); *H01L 24/05* (2013.01); *H01L 24/16* (2013.01); *H01L 24/32* (2013.01);
(Continued)

(58) Field of Classification Search
CPC ..... H01L 27/3276; H01L 24/05; H01L 24/16; H01L 24/32; H01L 24/73; H01L 27/3262;
(Continued)

(56) References Cited

U.S. PATENT DOCUMENTS

2007/0075313 A1* 4/2007 Kwak ................ H01L 27/3276
  257/E27.111
2014/0117320 A1* 5/2014 Jung .................. H01L 27/3276
  257/40
(Continued)

FOREIGN PATENT DOCUMENTS

KR    10-0637228    10/2006
KR    10-2007-0010422    1/2007
(Continued)

*Primary Examiner* — Nduka E Ojeh
*Assistant Examiner* — Laura M Dykes
(74) *Attorney, Agent, or Firm* — F. Chau & Associates, LLC

(57) ABSTRACT

A display device includes: a substrate; sub-pixels on the substrate; data lines connected to the sub-pixels; a display driving circuit supplying data voltages to the data lines; and fan-out lines on the substrate and connecting the data lines and the display driving circuit. Each of the sub-pixels includes a first transistor including a first active layer on the substrate and including a silicon semiconductor and a first gate electrode on the first active layer, and a second transistor including a second active layer on the substrate and including an oxide semiconductor and a second gate electrode on the second active layer. The fan-out lines include first fan-out lines and second fan-out lines alternately arranged each other in one direction. The first fan-out lines are arranged on the same layer as the first gate electrode, and the second fan-out lines are arranged on the same layer as the second gate electrode.

23 Claims, 20 Drawing Sheets

(52) U.S. Cl.
CPC .... *H01L 24/73* (2013.01); *H01L 2224/02331* (2013.01); *H01L 2224/02373* (2013.01); *H01L 2224/02375* (2013.01); *H01L 2224/02379* (2013.01); *H01L 2224/02381* (2013.01); *H01L 2224/0239* (2013.01); *H01L 2224/05569* (2013.01); *H01L 2224/16145* (2013.01); *H01L 2224/32148* (2013.01); *H01L 2224/73203* (2013.01); *H01L 2924/01022* (2013.01); *H01L 2924/01042* (2013.01); *H10K 59/1213* (2023.02)

(58) Field of Classification Search
CPC . H01L 2224/02331; H01L 2224/02373; H01L 2224/02375; H01L 2224/02379; H01L 2224/02381; H01L 2224/0239; H01L 2224/05569; H01L 2224/16145; H01L 2224/32148; H01L 2224/73203; H01L 2924/01022; H01L 2924/01042
USPC .......................................................... 257/43
See application file for complete search history.

(56) References Cited

U.S. PATENT DOCUMENTS

| | | | | |
|---|---|---|---|---|
| 2016/0351652 | A1* | 12/2016 | Kim | H01L 27/3248 |
| 2017/0125451 | A1* | 5/2017 | Kang | H01L 27/127 |
| 2018/0033821 | A1* | 2/2018 | Kim | H10K 59/00 |
| 2018/0366596 | A1* | 12/2018 | Chang | H01L 31/0352 |
| 2019/0006521 | A1* | 1/2019 | Noh | H01L 27/1248 |
| 2019/0081089 | A1* | 3/2019 | Cho | H01L 29/4958 |
| 2019/0115407 | A1* | 4/2019 | Cho | H01L 27/3262 |
| 2019/0198534 | A1* | 6/2019 | Je | H01L 29/78675 |
| 2023/0112912 | A1* | 4/2023 | Qing | G09G 3/3208 345/204 |

FOREIGN PATENT DOCUMENTS

| | | |
|---|---|---|
| KR | 10-2018-0051739 | 5/2018 |
| KR | 10-1999510 | 7/2019 |
| KR | 10-2019-0107227 | 9/2019 |

* cited by examiner

DISPLAY DEVICE WITH ALTERNATING FAN-OUT LINES

CROSS-REFERENCE

This application claims priority under 35 U.S.C. § 119 to Korean Patent Application No. 10-2020-0075494 filed on Jun. 22, 2020, the disclosure of which is incorporated by reference herein in its entirety.

TECHNICAL FIELD

Exemplary embodiments of the present disclosure relate to display devices, and more particularly relate to a display device having low film stress.

DISCUSSION OF RELATED ART

With the development of information society, requirements have increased for display devices to display images in various forms. For example, display devices are applied to various electronic appliances such as smart phones, digital cameras, notebook computers, navigators, and smart televisions. A display device may be a flat panel display device such as a liquid crystal display device, a field emission display device, or a light emitting display device.

Recently, with the increase in the demand for high-resolution display devices, the number of pixels used for displaying an image has increased. As the number of pixels increases, the number of data lines connected to the pixels increases. Further, the number of fan-out lines connecting data lines to a driving integrated circuit for outputting data voltages to the data lines also increases. In this case, particularly if the distance between the fan-out lines is close, stress applied to an inorganic film covering the fan-out lines is high, such that cracks may occur in the inorganic film.

SUMMARY

Exemplary embodiments of the present disclosure provide a display device capable of preventing cracks from occurring in an organic film by reducing the stress applied to the inorganic film covering fan-out lines.

According to an exemplary embodiment of the present disclosure, a display device comprises: a substrate; sub-pixels disposed on the substrate; data lines disposed on the substrate and connected to the sub-pixels; a display driving circuit disposed on the substrate and supplying data voltages to the data lines; and fan-out lines disposed on the substrate and connecting the data lines with the display driving circuit. Each of the sub-pixels includes a first transistor including a first active layer disposed on the substrate as well as a first gate electrode disposed on the first active layer, and a second transistor including a second active layer disposed on the substrate as well as a second gate electrode disposed on the second active layer. The fan-out lines include first fan-out lines and second fan-out lines alternately arranged with each other in one direction. The first fan-out lines are arranged on the same layer as the first gate electrode, and the second fan-out lines are arranged on the same layer as the second gate electrode.

In an exemplary embodiment, the first fan-out lines need not overlap the second fan-out lines in a thickness direction of the substrate.

In an exemplary embodiment, each of the first fan-out lines and the second fan-out lines may include a first metal layer and a second metal layer disposed on the first metal layer.

In an exemplary embodiment, the first metal layer may be thinner than the second metal layer.

In an exemplary embodiment, among the first fan-out lines and the second fan-out lines, a first fan-out line and a second fan-out line that are adjacent to each other may overlap each other in a thickness direction of the substrate.

In an exemplary embodiment, the display device may further include third fan-out lines alternately arranged with the second fan-out lines in the one direction, and disposed in a layer between the first fan-out lines and the second fan-out lines in a thickness direction of the substrate, wherein each of the sub-pixels includes a silicon semiconductor disposed on the first active layer and an oxide semiconductor disposed on the second active layer.

According to an exemplary embodiment of the present disclosure, a display device comprises: a substrate; a first active layer disposed on the substrate and including a first insulating film disposed on the first active layer; a first gate electrode and first fan-out lines arranged on the first insulating film; a second insulating film disposed on the first gate electrode and the first fan-out lines; a second active layer disposed on the second insulating film and including a third insulating film disposed on the second active layer; a second gate electrode and second fan-out lines arranged on the third insulating film; and a fourth insulating film disposed on the second gate electrode and the second fan-out lines.

In an exemplary embodiment, the first fan-out lines and the second fan-out lines may be alternately arranged with each other in one direction.

In an exemplary embodiment, the first fan-out lines need not overlap the second fan-out lines in a thickness direction of the substrate.

In an exemplary embodiment, each of the first fan-out lines and the second fan-out lines may include a first metal layer and a second metal layer disposed on the first metal layer.

In an exemplary embodiment, the first metal layer may be thinner than the second metal layer.

In an exemplary embodiment, among the first fan-out lines and the second fan-out lines, a first fan-out line and a second fan-out line that are adjacent to each other may overlap each other in a thickness direction of the substrate.

In an exemplary embodiment, the second insulating film may include a first sub-insulating film and a second sub-insulating film, and the display device may further include third fan-out lines disposed on the first sub-insulating film and covered by the second sub-insulating film.

In an exemplary embodiment, the first fan-out lines, the second fan-out lines, and the third fan-out lines may be arranged in order of a first fan-out line, a second fan-out line, a third fan-out line, and another second fan-out line.

In an exemplary embodiment, the first fan-out lines, the second fan-out lines, and the third fan-out lines need not overlap each other in a thickness direction of the substrate.

In an exemplary embodiment, among the first fan-out lines and the second fan-out lines, a first fan-out line and a second fan-out line that are adjacent to each other may overlap each other in a thickness direction of the substrate, and among the second fan-out lines and the third fan-out lines, a second fan-out line and a third fan-out line that are adjacent to each other may overlap each other in the thickness direction of the substrate.

In an exemplary embodiment, the display device may further comprise: a first driving pad line disposed on the fourth insulating film and connected to any one of the first fan-out lines through a first fan-out contact hole penetrating the second insulating film and the fourth insulating film; and a second driving pad line disposed on the fourth insulating film and connected to any one of the second fan-out lines through a second fan-out contact hole penetrating the fourth insulating film.

In an exemplary embodiment, the display device may further comprise: a first organic film disposed on the first driving pad line and the second driving pad line; and a first driving pad connected to the first driving pad line through a first pad contact hole penetrating the first organic film.

In an exemplary embodiment, the display device may further comprise: a display driving circuit including a first bump electrode electrically connected to the first driving pad.

In an exemplary embodiment, the display device may further comprise: a conductive adhesive disposed between the first driving pad and the first bump electrode.

In an exemplary embodiment, the display device may further include third fan-out lines alternately arranged with at least one of the first fan-out lines or the second fan-out lines in one direction, and disposed in a layer between the first fan-out lines and the second fan-out lines in a thickness direction of the substrate, wherein the first active layer includes a silicon semiconductor, and the second active layer includes an oxide semiconductor.

According to an exemplary embodiment of the present disclosure, a display device comprises: a substrate; a first active layer disposed on the substrate and including a first insulating film disposed on the first active layer; a first gate electrode disposed on the first insulating film; a first sub-insulating film of a second insulating film disposed on the first gate electrode; first fan-out lines arranged on the first sub-insulating film; a second sub-insulating film of the second insulating film disposed on the first fan-out lines; a second active layer disposed on the second sub-insulating film and including a third insulating film disposed on the second active layer; a second gate electrode and second fan-out lines arranged on the third insulating film; and a fourth insulating film disposed on the second gate electrode and the second fan-out lines.

In an exemplary embodiment, the display device may further include third fan-out lines alternately arranged with at least one of the second fan-out lines or the third fan-out lines in one direction, and disposed on the second sub-insulating film, wherein at least one of the first active layer or the second active layer includes a silicon semiconductor, and at least the other of the first active layer or the second active layer includes an oxide semiconductor.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
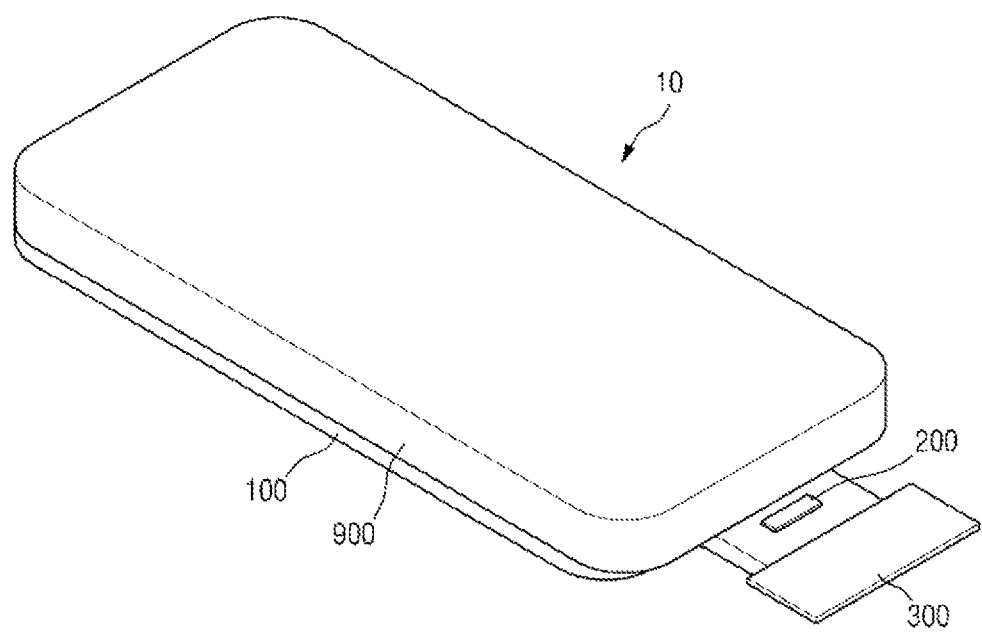
FIG. 1 is a perspective view diagram of a display device according to an embodiment.
Figure 1:
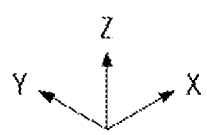

Exemplary embodiments of the present disclosure will be described more fully hereinafter with reference to the accompanying drawings. Like reference numerals may refer to like elements throughout the accompanying drawings.

It shall be understood that when a component, such as a film, a region, a layer, or an element, is referred to as being "on", "connected to", "coupled to", or "adjacent to" another component, it can be directly on, connected, coupled, or adjacent to the other component, or intervening components may be present. It shall also be understood that when a component is referred to as being "between" two components, it can be the only component between the two components, or one or more intervening components may also be present. It shall also be understood that when a component is referred to as "covering" another component, it can be the only component covering the other component, or one or more intervening components may also be covering the other component. Other words used to describe the relationship between elements may be interpreted in a like fashion.

It shall be further understood that descriptions of features or aspects within each exemplary embodiment are available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", or the like, may be used herein for ease of description to describe one element's or feature's relationship to another element(s) or feature(s) as illustrated in the figures. It shall be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It shall be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when one value is described as being about the same as or about equal to another value, it is to be understood that the values are equal to each other to within a measurement error, or if measurably unequal, are close enough in value to be functionally equal to each other as would be understood by a person having ordinary skill in the art. It shall be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art (e.g., within a measurement error). Other uses of the terms "substantially" and "about" should be interpreted in a like fashion.

Hereinafter, embodiments of the present disclosure will be described with reference to the attached drawings.

Figure 2:
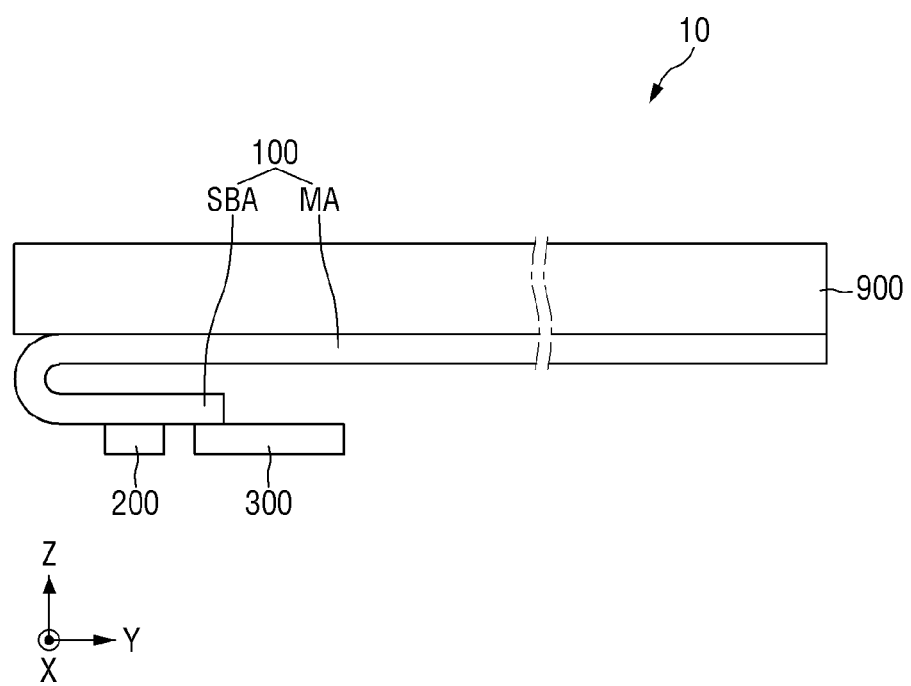
FIG. 2 is a side view diagram of a display device according to an embodiment.

FIG. 1 shows a perspective view of a display device according to an embodiment, and FIG. 2 shows a side view of a display device according to an embodiment.

Referring to FIGS. 1 and 2, a display device 10, which is a device for displaying a moving image or a still image, may be used as a display screen of various products such as televisions, notebooks, monitors, billboards, internet of things devices (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra-mobile PCs (UMPCs).

The display device 10 may be a light emitting display device such as an organic light emitting display device using an organic light emitting diode, a quantum dot light emitting display device including a quantum dot light emitting layer, an inorganic light emitting display device including an inorganic semiconductor, or a micro light emitting display device using a micro light emitting diode (LED). Hereinafter, the display device 10 may be mainly described as an organic light emitting display device, but the present disclosure is not limited thereto.

The display device 10 includes a display panel 100, a display driving circuit 200, a circuit board 300, and a cover window 900.

The display panel 100 may have a substantially rectangular planar shape having short sides in the first direction (X-axis direction) and long sides in the second direction (Y-axis direction). The corners where each short side in the first direction (X-axis direction) meets the long side in the second direction (Y-axis direction) may be formed to have a round shape of a predetermined curvature, or may have a substantially right-angle shape. The planar shape of the display panel 100 is not limited to a substantially rectangular shape, and may be formed in another polygonal shape, circular shape, or elliptical shape. The display panel 100 may be formed to be flat, but the present disclosure is not limited thereto. For example, the display panel 100 may include a curved portion formed at the left and right ends thereof and having a constant curvature or a variable curvature. In addition, the display panel 100 may be flexible to be bent, warped, folded, wrapped, or rolled.

The display panel 100 may include a main area MA and a sub-area SBA. The main area MA refers to an area in which sub-pixels SP are formed to display an image, and the sub-area SBA refers to an area in which the display driving circuit 200 and the circuit board 300 are disposed.

FIG. 1 shows a case where the sub-area SBA is unbent or unfolded, and FIG. 2 shows a case where the sub-area SBA is bent or folded to be disposed on the lower surface of the display panel 100. The sub-area SBA may overlap the main area MA in the thickness direction (Z-axis direction) of the display panel 100.

The display driving circuit 200 may be disposed in the sub-area SBA. The display driving circuit 200 may be formed as an integrated circuit (IC), and may be attached to driving pads of the sub-area SBA of the display panel 100 by a chip on glass (COG) method, a chip on plastic (COP) method, or an ultrasonic bonding method, without limitation. Thus, the display driving circuit 200 may be electrically connected to the driving pads. Alternatively, the display driving circuit 200 may be attached onto the circuit board 300.

The display driving circuit 200 may receive digital video data DATA and timing signals from the circuit board 300. The display driving circuit 200 may generate a scan timing signal and a light emission timing signal for controlling the operation timing of a scan driver according to the timing signals. Further, the display driving circuit 200 may generate a data timing signal for controlling the supply timing of analog data voltages.

The circuit board 300 may be disposed in the sub-area SBA of the display panel 100. The circuit board 300 may be attached to circuit pads of the sub-area SBA of the display panel 100 using an anisotropic conductive film. The anisotropic conductive film may be primarily conductive in the thickness direction (Z-axis direction) of the display panel 100. Thus, the circuit board 300 may be electrically connected to the circuit pads. The circuit board 300 may be a flexible printed circuit board, a printed circuit board, or flexible film such as a chip on film.

The cover window 900 may be disposed on the upper surface of the display panel 100. The cover window 900 may be disposed on the display panel 100 to cover the upper surface of the display panel 100. The cover window 900 may serve to protect the upper surface of the display panel 100. The cover window 900 may be attached to the upper surface of the display panel 100 using a transparent adhesive.

The cover window 900 is made of a transparent material, such as, for example, glass or plastic. For example, when the cover window 900 is made of glass, it may be an ultra-thin glass (UTG) film having a thickness of 0.1 mm or less. Alternatively, when the cover window 900 is made of plastic, it may be a transparent polyimide film.

Figure 3:
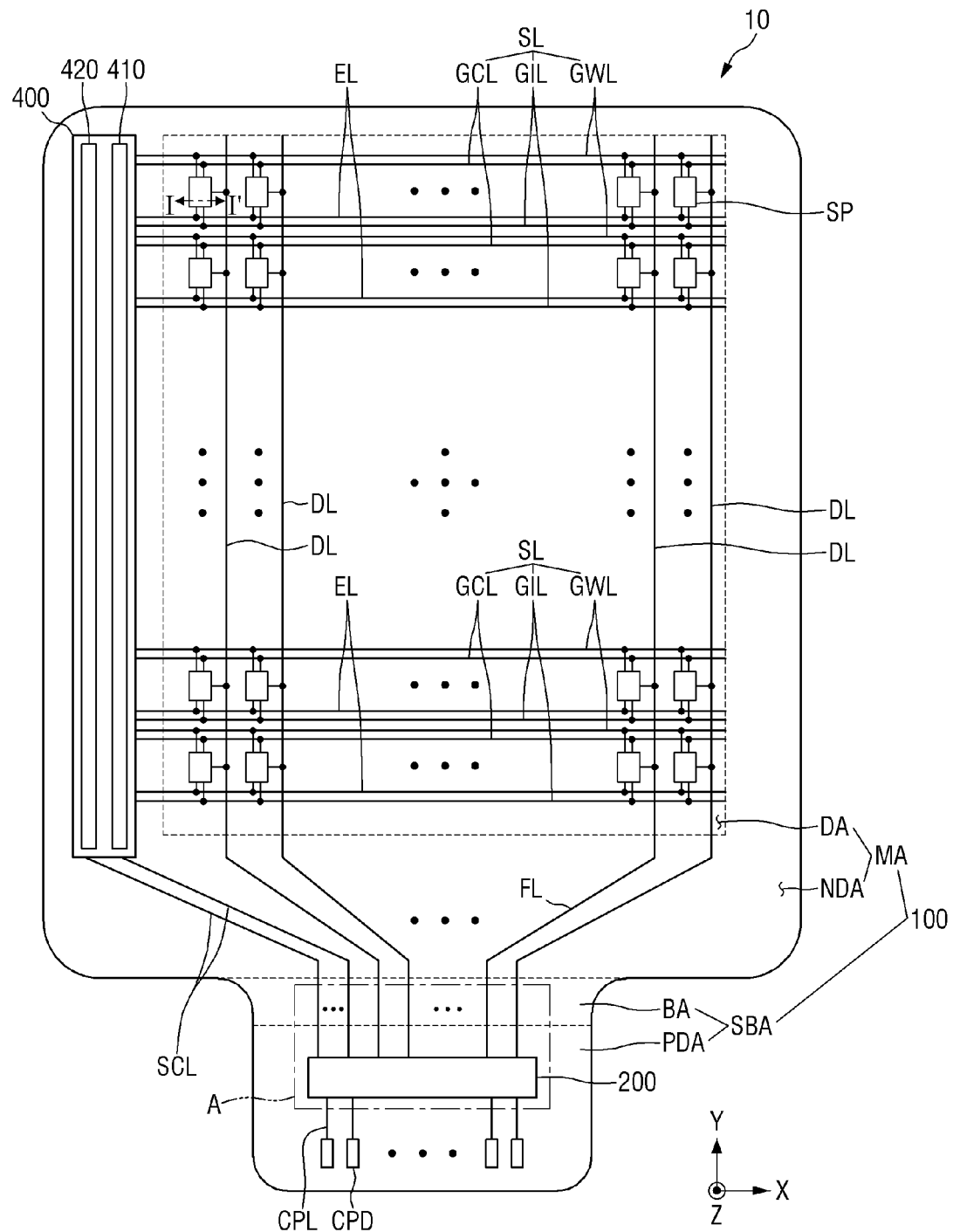
FIG. 3 is a layout view diagram of a display device according to an embodiment.

FIG. 3 shows a layout view of a display device according to an embodiment.

Referring to FIG. 3, the main area MA of the display panel 100 of the display device 10 may include a display area DA for displaying an image, and a non-display area NDA which is a peripheral area of the display area DA. The sub-area SBA of the display panel 100 may include a bending area BA and a pad area PDA.

The display area DA may be provided with scan lines SL, light emission lines EL, and data lines DL as well as sub-pixels SP. The scan lines SL may include scan write lines GWL, scan control lines GCL, and scan initialization lines GIL. The scan write lines GWL, the scan control lines GCL, the scan initialization lines GIL, and the light emission lines EL may extend in the first direction (X-axis direction), and may be arranged in the second direction (Y-axis direction). The data lines DL may extend in the second direction (Y-axis direction), and may be arranged in the first direction (X-axis direction). Each of the sub-pixels SP may be connected to the scan write line GWL, the scan control line GCL, the scan initialization line GIL, and the data line DL.

Figure 4:
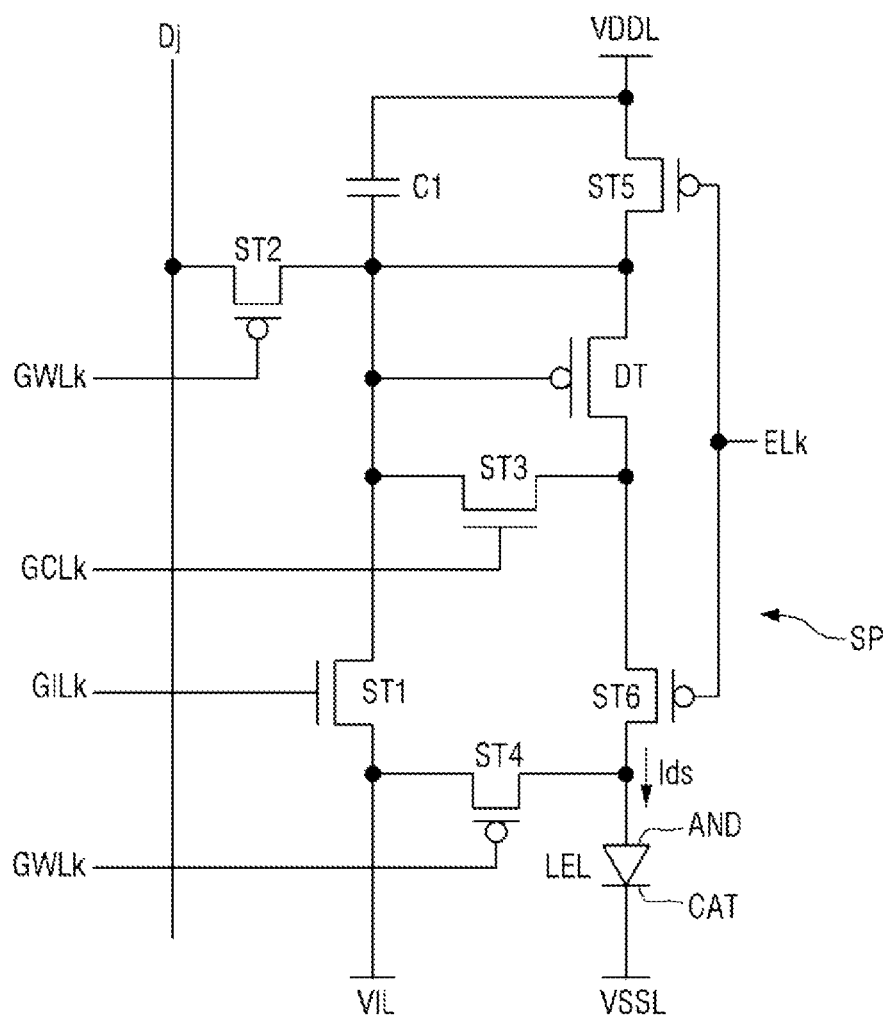
FIG. 4 is a schematic circuit diagram illustrating an example of the sub-pixel of FIG. 3.

FIG. 4 shows an example of the sub-pixel of FIG. 3. Referring to FIG. 4, each of the sub-pixels SP may include a driving transistor DT, a plurality of switch elements ST1-ST6, a light emitting element LEL, and a capacitor C1. The plurality of switch elements may be controlled by the scan write line GWL, the scan control line GCL, and the scan initialization line GIL, and thus a data voltage of the data line DL may be applied to a gate electrode of the driving transistor. The driving transistor DT may emit light by supplying a driving current to the light emitting element according to the data voltage applied to the gate electrode. The light emitting element may emit light according to the driving current of the driving transistor DT. The light emitting element may be an organic light emitting diode including a first electrode, an organic light emitting layer, and a second electrode. Alternatively, the light emitting element may be an inorganic light emitting diode including a first electrode, an inorganic semiconductor, and a second electrode. The capacitor may serve to maintain the data voltage applied to the gate electrode of the driving transistor DT for a predetermined period. The sub-pixel SP may be described in greater detail later with reference to FIG. 5.

Referring back to FIG. 3, the non-display area NDA may be an area from the outside of the display area DA to the edge of the display panel 100. The non-display area NDA may be provided with a scan driver 400 for applying scan signals to the scan lines SL, and fan-out lines FL connecting the data lines DL and the display driving circuit 200.

The scan driver 400 may be connected to the display driving circuit 200 through the scan control lines SCL. The scan driver 400 may receive a scan timing signal and a light emission timing signal from the display driving circuit 200 through the scan control lines SCL.

The scan driver 400 may include a scan signal output unit 410 and a light emission signal output unit 420. The scan signal output unit 410 may generate scan write signals according to the scan timing signal and sequentially output the scan write signals to the scan write lines GWL. The scan signal output unit 410 may generate scan control signals according to the scan timing signal and sequentially output the scan control signals to the scan control lines GCL. The scan signal output unit 410 may generate scan initialization signals according to the scan timing signal and sequentially output the scan initialization signals to the scan initialization lines GIL. The light emission signal output unit 420 may generate light emission signals according to the light emission timing signal and sequentially output the light emission signals to the light emission lines EL.

Although FIG. 3 illustrates an example in which the scan driver 400 is formed in the non-display area NDA at one side of the display area DA such as, for example, at the left side of the display area DA, the present disclosure is not limited thereto. For example, the scan driver 400 may be formed in the non-display area NDA on two or more sides of the display area DA such as, for example, at the left and right sides of the display area DA.

The sub-area SBA may protrude in the second direction (Y-axis direction) from one side of the main area MA. The length of the sub-area SBA in the first direction (X-axis direction) may be less than the length of the main area MA in the first direction (X-axis direction), and the length of the sub-area SBA in the second direction (Y-axis direction) may be less than the length of the main area MA in the second direction (Y-axis direction), but the present disclosure is not limited thereto.

The sub-area SBA may include a bending area BA, and a pad area PDA in which driving pads connected to the circuit pads CPD and the display driving circuit 200 are disposed. The bending area BA may be disposed between the main area MA and the pad area PDA. The bending area BA may be bent or folded, and thus the pad area PDA may be disposed under the main area MA.

The fan-out lines FL may be arranged in the bending area BA and the pad area PDA.

The interval between neighboring fan-out lines FL in the first direction (X-axis direction) in the sub-area SBA may be less than the interval between neighboring fan-out lines FL in the first direction (X-axis direction) in the non-display area NDA of the main area MA.

The display driving circuit 200 and the circuit pads CPD may be disposed in the pad area PDA. The display driving circuit 200, as compared with the circuit pads CPD, may be disposed adjacent to the bending area BA.

The circuit pads CPD may be connected to the display driving circuit 200 through circuit pad lines CPL. Therefore, the display driving circuit 200 may be electrically connected to the circuit board 300 through circuit pads CPD.

Further, the display driving circuit 200 may be electrically connected to the data lines DL through the fan-out lines FL. Therefore, the display driving circuit 200 may convert digital video data into analog data voltages according to the data timing signal generated by the display driving circuit 200 for controlling the supply timing of the analog data voltages, and output the analog data voltages to the data lines DL through the fan-out lines FL.

Returning now to FIG. 4, the sub-pixel SP may be connected to a k-th (k is a positive integer) scan initialization line GILk, a k-th scan writing line GWLk, and a k-th scan control line GCLk. Further, sub-pixel SP may be connected to a first driving voltage line VDDL to which a first driving voltage is supplied, an initialization voltage line VIL to which an initialization voltage Vini is supplied, and a second driving voltage line VSSL to which a second driving voltage is supplied.

The sub-pixel SP includes the driving transistor DT, the light emitting element LEL, the switch elements ST1-ST6, and the capacitor C1. The switch elements ST1-ST6 include first to sixth transistors ST1, ST2, ST3, ST4, ST5, and ST6.

The driving transistor DT may include a gate electrode, a first electrode, and a second electrode. The driving transistor DT controls a drain-source current (Ids, hereinafter referred to as "driving current") flowing between the first electrode and the second electrode according to the data voltage applied to the gate electrode.

The light emitting element LEL emits light according to the driving current Ids. The light emission amount or intensity of the light emitting element LEL may be proportional to the driving current Ids.

The light emitting element LEL may be an organic light emitting diode including an anode electrode, a cathode electrode, and an organic light emitting layer disposed between the anode electrode and the cathode electrode. Alternatively, the light emitting element LEL may be an inorganic light emitting element including an anode electrode, a cathode electrode, and an inorganic semiconductor disposed between the anode electrode and the cathode electrode. Alternatively, the light emitting element LEL may be a quantum dot light emitting element including an anode electrode, a cathode electrode, and a quantum dot light emitting layer disposed between the anode electrode and the cathode electrode. Alternatively, the light emitting element LEL may be a micro light emitting diode, without limitation.

The anode electrode of the light emitting element EL may be connected to the first electrode of the fourth transistor ST4 and the second electrode of the sixth transistor ST6, and the cathode electrode thereof may be connected to the second driving voltage line VSSL. A parasitic capacitance Cel may be formed between the anode electrode and cathode electrode of the light emitting element EL.

The first transistor ST1 is turned on by the scan initialization signal of the k-th scan initialization line GILk to connect the gate electrode of the driving transistor DT and the initialization voltage line VIL. The gate electrode of the driving transistor DT may be discharged to the initialization voltage of the initialization voltage line VIL. The gate electrode of the first transistor ST1 may be connected to the k-th scan initialization line GILk, the first electrode thereof may be connected to the gate electrode of the driving transistor DT, and the second electrode thereof may be connected to the initialization voltage line VIL.

The second transistor ST2 is turned on by the scan write signal of the k-th scan write line GWLk to connect the first electrode of the driving transistor DT and the j-th data line Dj. The gate electrode of the second transistor ST2 may be connected to the k-th scan write line GWLk, the first electrode thereof may be connected to the first electrode of the driving transistor DT, and the second electrode thereof may be connected to the data line Dj.

The third transistor ST3 is turned on by the scan control signal of the k-th scan control line GCLk to connect the gate electrode and second electrode of the driving transistor DT. That is, when the third transistor ST3 is turned on, since the gate electrode and second electrode of the driving transistor DT are connected to each other, the driving transistor DT is driven as a diode. The gate electrode of the third transistor ST3 may be connected to the k-th scan control line GCLk, the first electrode thereof may be connected to the second electrode of the driving transistor DT, and the second electrode thereof may be connected to the gate electrode of the driving transistor DT.

The fourth transistor ST4 is turned on by the scan write signal of the k-th scan write line GWLk to connect the anode electrode AND of the light emitting element LEL and the initialization voltage line VIL. The anode electrode AND of the light emitting element LEL may be discharged to the initialization voltage. The gate electrode of the fourth transistor ST4 may be connected to the k-th scan write line GWLk without limitation, the first electrode thereof may be connected to the anode electrode AND of the light emitting element LEL, and the second electrode thereof may be connected to the initialization voltage line VIL. Although the second transistor ST2 and the fourth transistor ST4 are shown here as gated to the same k-th scan write line, they may be gated to successive k-th and k+1th scan write lines and/or include an in-line delay element.

The fifth transistor ST5 is turned on by the light emission control signal of the k-th light emission line ELk to connect the first electrode of the driving transistor DT and the first driving voltage line VDDL. The gate electrode of the fifth transistor ST5 may be connected to the k-th light emission line ELk, the first electrode thereof may be connected to the first driving voltage line VDDL, and the second electrode thereof may be connected to the source electrode of the driving transistor DT.

The sixth transistor ST6 is connected between the second electrode of the driving transistor DT and the anode electrode of the light emitting element LEL. The sixth transistor ST6 is turned on by the light emission control signal of the k-th light emission line ELk to connect the second electrode of the driving transistor DT and the anode electrode of the light emitting element LEL. The gate electrode of the sixth transistor ST6 may be connected to the k-th light emission line ELk, the first electrode thereof may be connected to the second electrode of the driving transistor DT, and the second electrode thereof may be connected to the anode electrode of the light emitting element LEL. When both the fifth transistor ST5 and the sixth transistor ST6 are turned on, the driving current Ids may be supplied to the light emitting element LEL.

The capacitor C1 is formed between the second electrode of the driving transistor DT and the first driving voltage line VDDL. One electrode of the capacitor C1 may be connected to the second electrode of the driving transistor DT, and the other electrode thereof may be connected to the first driving voltage line VDDL.

When the first electrode of each of the first to sixth transistors ST1, ST2, ST3, ST4, ST5, and ST6 and the driving transistor DT is a source electrode, the second electrode thereof may be a drain electrode. Alternatively, when the first electrode of each of the first to sixth transistors ST1, ST2, ST3, ST4, ST5, and ST6 and the driving transistor DT is a drain electrode, the second electrode thereof may be a source electrode.

The active layer of each of the first to sixth transistors ST1, ST2, ST3, ST4, ST5, and ST6 and the driving transistor DT may be formed of any one of a silicon semiconductor such as polysilicon or amorphous silicon and an oxide semiconductor. For example, the active layer of each of the driving transistor DT, the second transistor ST2, the fourth transistor ST4, the fifth transistor ST5, and the sixth transistor ST6, which are formed as P-type MOSFETs, may be formed of a silicon semiconductor, and the active layer of each of the first transistor ST1 and the third transistor ST3, which are formed as N-type MOSFETs, may be formed of an oxide semiconductor.

Figure 5:
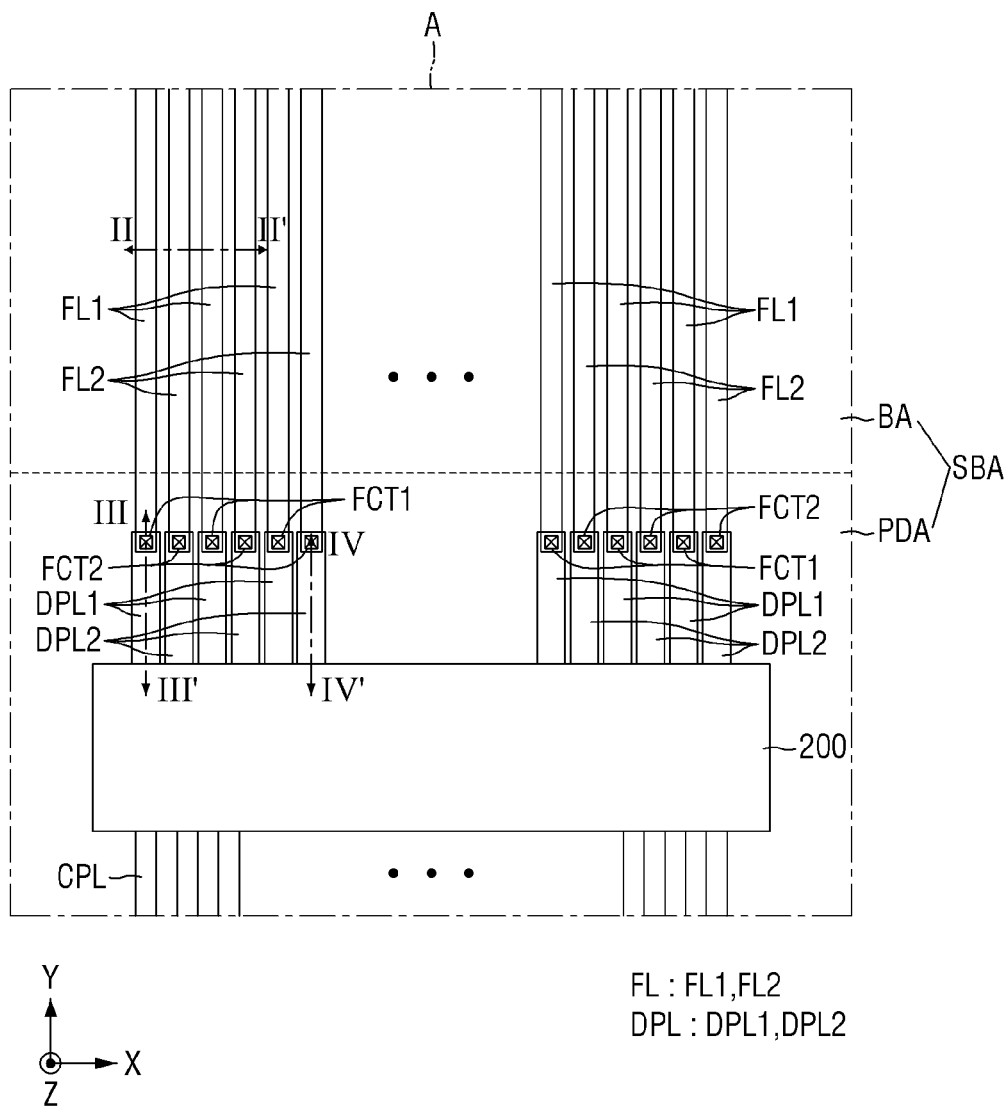
FIG. 5 is a layout view diagram specifically illustrating an example of the fan-out lines of FIG. 3.

FIG. 5 shows a layout view specifically illustrating an example of the fan-out lines of FIG. 3. FIG. 5 shows the fan-out lines in the area A of FIG. 3. That is, FIG. 5 shows the fan-out lines FL arranged in portions of the bending area BA and the pad area PDA in a portion of the sub-area SBA of FIG. 3.

Referring to FIG. 5, the fan-out lines FL may be arranged in the bending area BA.

The fan-out lines FL include first fan-out lines FL1 and second fan-out lines FL2. The first fan-out lines FL1 and the second fan-out lines FL2 may be alternately arranged in the first direction (X-axis direction). That is, the first fan-out lines FL1 and the second fan-out lines FL2 may be repeatedly arranged in the first direction (X-axis direction) in order of the first fan-out line FL1, the second fan-out line FL2, the first fan-out line FL1, and the second fan-out line FL2.

The display driving circuit 200, the driving pad lines DPL, and the circuit pad lines CPL may be arranged in the pad area PDA.

The driving pad lines DPL may include first driving pad lines DPL1 and second driving pad lines DPL2. The first driving pad lines DPL1 and the second driving pad lines DPL2 may be connected to first driving pads disposed under the display driving circuit 200. For example, since first bump electrodes of the display driving circuit 200 are connected to the first driving pads by a conductive adhesive such as an anisotropic conductive film, the first driving pad lines DPL1 and the second driving pad lines DPL2 may be electrically connected to the first bump electrodes of the display driving circuit 200. Therefore, the display driving circuit 200 may output data voltages through the first bump electrodes.

The first driving pad lines DPL1 and the second driving pad lines DPL2 may be alternately arranged in the first direction (X-axis direction). That is, the first driving pad lines DPL1 and the second driving pad lines DPL2 may be alternately arranged in the first direction (X-axis direction) in order of the first driving pad line DPL1, the second driving pad line DPL2, the first driving pad line DPL1, and the second driving pad line DPL2.

The first driving pad lines DPL1 and the second driving pad lines DPL2 may be connected one-to-one to the first fan-out lines FL1 and the second fan-out lines FL2. Each of the first driving pad lines DPL1 may be connected to the first fan-out line FL1 through a first fan-out contact hole FCT1. Each of the second driving pad lines DPL2 may be connected to the second fan-out line FL2 through a second fan-out contact hole FCT2.

The circuit pad lines CPL may be connected to second driving pads disposed under the display driving circuit 200. Since second bump electrodes of the display driving circuit 200 are connected to the second driving pads by a conductive adhesive such as an anisotropic conductive film, the circuit pad lines CPL may be electrically connected to the second bump electrodes of the display driving circuit 200. Therefore, the display driving circuit 200 may receive digital video data and timing signals from the circuit board through the second bump electrodes. The first bump electrodes may be arranged over the display driving circuit 200, and the second driving pads may be disposed under the display driving circuit.

The circuit pad lines CPL may be connected to the circuit pads CPD. The circuit pad lines CPL may be connected one-to-one to the circuit pads CPD and the second driving pads. That is, each of the circuit pad lines CPL may be connected to the circuit pad CPD and the second driving pad.

The interval between the circuit pad lines CPL neighboring in the first direction (X-axis direction) may be less than the interval between the first driving pad line DPL1 and second driving pad line DPL2 neighboring in the first direction (X-axis direction), and may be less than the interval between the first fan-out line FL1 and second fan-out line FL2 neighboring in the first direction (X-axis direction). Since the interval between the first fan-out line FL1 and second fan-out line FL2 neighboring in the first direction (X-axis direction) is small, stress may be high in the inorganic film covering the first fan-out lines FL1 and the inorganic film covering the second fan-out lines FL2. In particular, since the first fan-out lines FL1 and the second fan-out lines FL2 are arranged in the bending area BA, bending stress may be additionally applied to the inorganic films of the bending area BA. Therefore, a method is provided for reducing the stress applied to the inorganic film covering the first fan-out lines FL1 and the inorganic film covering the second fan-out lines FL2. Details thereof may be described later with reference to FIGS. 7 and 8.

Figure 6:
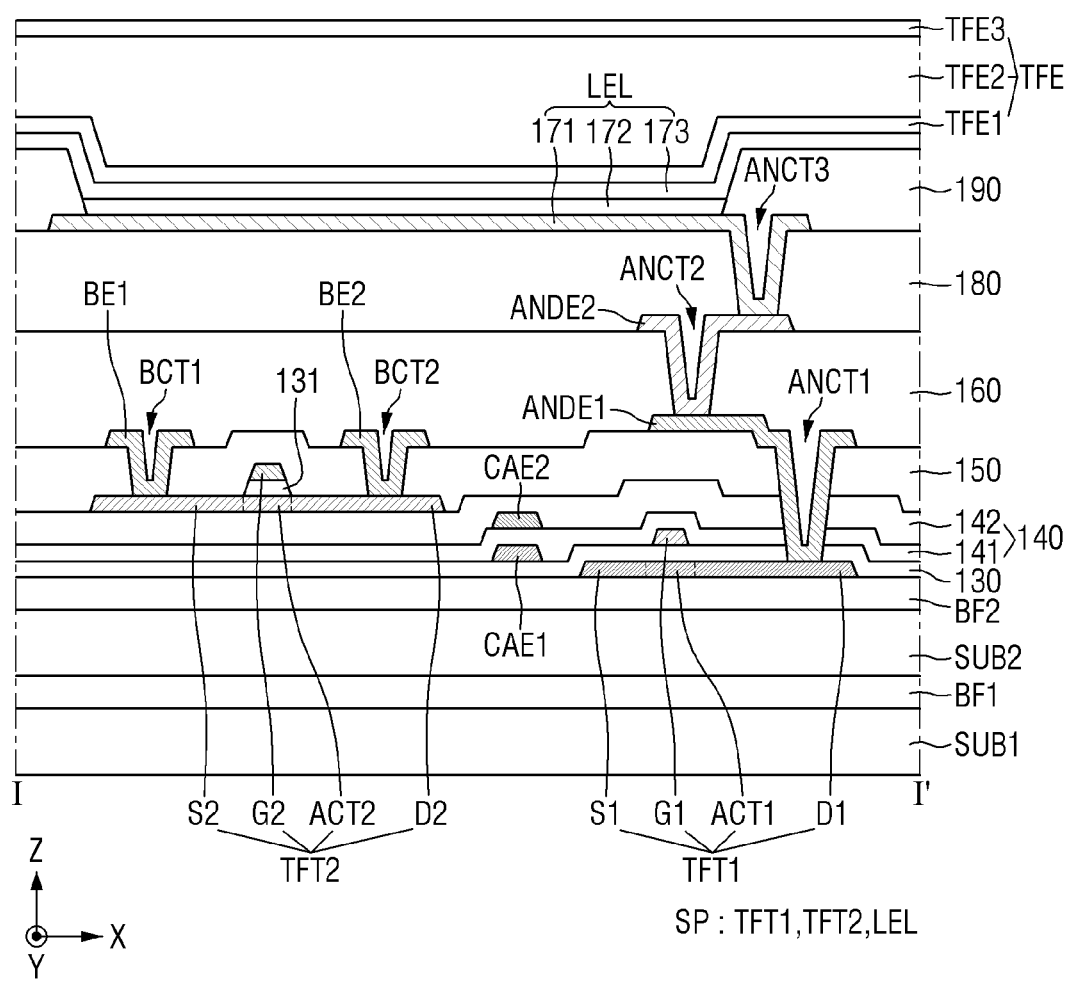
FIG. 6 is a cross-sectional view diagram illustrating an example of the sub-pixel taken along the line I-I' of FIG. 3.

FIG. 6 shows a cross-sectional view for an example of the sub-pixel of FIG. 3.

Referring to FIG. 6, each of the sub-pixels SP displaying an image may include a first thin film transistor TFT1, a second thin film transistor TFT2, and a light emitting element LEL. The first thin film transistor TFT1 may be the sixth transistor ST6 of FIG. 5, and the second thin film transistor TFT2 may be the first transistor ST1 or third transistor ST3 of FIG. 5. That is, for convenience of explanation, FIG. 6 shows only some of the driving transistor DT and first to sixth transistors ST1 to ST6 of FIG. 5.

A first buffer film BF1 may be disposed on a first substrate SUB1, a second substrate SUB2 may be disposed on the first buffer film BF1, and a second buffer film BF2 may be disposed on the second substrate SUB2.

Each of the first substrate SUB1 and the second substrate SUB2 may be made of an insulating material such as a polymer resin. For example, each of the first substrate SUB1 and the second substrate SUB2 may include polyimide. Each of the first substrate SUB1 and the second substrate SUB2 may be a flexible substrate capable of bending, folding, rolling, or the like.

Each of the first buffer film BF1 and the second buffer film BF2 may protect a thin film transistors such as TFT1 and TFT2 and a light emitting layer 172 of each light emitting element LEL from moisture penetrating through the first substrate SUB1 and the second substrate SUB2, which may be vulnerable to moisture permeation. Each of the first buffer film BF1 and the second buffer film BF2 may be formed of a plurality of alternately stacked inorganic films. For example, each of the first buffer film BF1 and the second buffer film BF2 may be formed as a multi-layer film in which one or more inorganic layers of a silicon nitride layer, a silicon oxynitride layer, a silicon oxide layer, a titanium oxide layer, and/or an aluminum oxide layer are alternately stacked.

A first thin film transistor TFT1 and a second thin film transistor TFT2 may be disposed on the second buffer film BF2. The first thin film transistor TFT1 may include a first active layer ACT1, a first gate electrode G1, a first source electrode S1, and a first drain electrode D1. The second thin film transistor TFT2 may include a second active layer ACT2, a second gate electrode G2, a second source electrode S2, and a second drain electrode D2.

The first active layer ACT1, the first source electrode S1, and the first drain electrode D1 of the first thin film transistor TFT1 may be disposed on the second buffer film BF2. The first active layer ACT1 may include a silicon semiconductor such as polycrystalline silicon, monocrystalline silicon, low-temperature polycrystalline silicon, or amorphous silicon. Each of the first source electrode S1 and the first drain electrode D1 may have conductivity because it includes a silicon semiconductor doped with ions or impurities. The first active layer ACT1 may overlap the first gate electrode G1 in the third direction (Z-axis direction), and the first source electrode S1 and the first drain electrode D1 need not overlap the first gate electrode G1 in the third direction (Z-axis direction).

A first gate insulating film 130 may be disposed on the first active layer ACT1, the first source electrode S1, and the first drain electrode D1 of the first thin film transistor TFT1. The first gate insulating film 130 may be formed of an inorganic layer, such as, for example, a silicon nitride layer, a silicon oxy nitride layer, a silicon oxide layer, a titanium oxide layer, or an aluminum oxide layer.

The first gate electrode G1 of the first thin film transistor TFT1 and a first capacitor electrode CAE1 may be disposed on the first gate insulating film 130. The first gate electrode G1 may overlap the first active layer ACT1 in the third direction (Z-axis direction). The first capacitor electrode CAE1 may overlap a second capacitor electrode CAE2 in the third direction (Z-axis direction). The first gate electrode G1 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A first interlayer insulating film 141 may be disposed on the first gate electrode G1 and the first capacitor electrode CAE1. The first interlayer insulating film 141 may be formed of an inorganic layer, such as, for example, a silicon nitride layer, a silicon oxy nitride layer, a silicon oxide layer, a titanium oxide layer, or an aluminum oxide layer.

The second capacitor electrode CAE2 may be disposed on the first interlayer insulating film 141. Since the first interlayer insulating film 141 has a predetermined dielectric constant, a capacitor may be formed by the first capacitor electrode CAE1, the second capacitor electrode CAE2, and the first interlayer insulating film 141 between the first capacitor electrode CAE1 and the second capacitor electrode CAE2. The second capacitor electrode CAE2 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A second interlayer insulating film 142 may be disposed on the second capacitor electrode CAE2. The second interlayer insulating film 142 may be formed of an inorganic layer, such as, for example, a silicon nitride layer, a silicon oxy nitride layer, a silicon oxide layer, a titanium oxide layer, or an aluminum oxide layer. The second interlayer insulating film 142 may include a plurality of inorganic layers, and the thickness of the second interlayer insulating film 142 in the third direction (Z-axis direction) may be greater than the thickness of the first interlayer insulating film 141 in the third direction (Z-axis direction).

The second active layer ACT2, the second source electrode S2, and the second drain electrode D2 of the second thin film transistor TFT2 may be disposed on the second interlayer insulating film 142. The second active layer ACT2 may include an oxide semiconductor. Each of the second source electrode S2 and the second drain electrode D2 may have conductivity because each may include an oxide semiconductor doped with ions or impurities. The second active layer ACT2 may overlap the second gate electrode G2 in the third direction (Z-axis direction), and the second source electrode S2 and the second drain electrode D2 need not overlap the second gate electrode G2 in the third direction (Z-axis direction).

A second gate insulating film 131 may be disposed on the second active layer ACT2, the second source electrode S2, and the second drain electrode D2 of the second thin film transistor TFT2. The second gate insulating film 131 may be formed of an inorganic layer, such as, for example, a silicon nitride layer, a silicon oxy nitride layer, a silicon oxide layer, a titanium oxide layer, or an aluminum oxide layer.

The second gate electrode G2 of the second thin film transistor TFT2 may be disposed on the second gate insulating film 131. The second gate electrode G2 may overlap the second active layer ACT2 in the third direction (Z-axis direction). The second gate electrode G2 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

An insulating film 150 may be disposed on the second gate electrode G2. The insulating film 150 may be formed of an inorganic layer, such as, for example, a silicon nitride layer, a silicon oxy nitride layer, a silicon oxide layer, a titanium oxide layer, or an aluminum oxide layer. The insulating film 150 may include a plurality of inorganic layers.

A first anode connection electrode ANDE1, a first connection electrode BE1, and a second connection electrode BE2 may be disposed on the insulating film 150. The first anode connection electrode ANDE1 may be connected to the first drain electrode D1 through a first anode contact hole ANCT1 penetrating the interlayer insulating film 140 and the insulating film 150 to expose the first drain electrode D1 of the first thin film transistor TFT1. The interlayer insulating film 140 may include the first interlayer insulating film 141 and the second interlayer insulating film 142. The first connection electrode BE1 may be connected to the second source electrode S2 through a first connection contact hole BCT1 penetrating the insulating film 150 to expose the second source electrode S2 of the second thin film transistor TFT2. The second connection electrode BE2 may be connected to the second drain electrode D2 through a second connection contact hole BCT2 penetrating the insulating film 150 to expose the second drain electrode D2 of the second thin film transistor TFT2. Each of the first anode connection electrode ANDE1, the first connection electrode BE1, and the second connection electrode BE2 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A first organic film 160 for planarization may be disposed on the first anode connection electrode ANDE1, the first connection electrode BE1, and the second connection electrode BE2. The first organic film 160 may be formed of an acrylic resin, an epoxy resin, a phenolic resin, a polyamide resin, or a polyimide resin.

A second anode connection electrode ANDE2 may be disposed on the first organic film 160. The second anode connection electrode ANDE2 may be connected to the first anode connection electrode ANDE1 through a second anode contact hole ANCT2 penetrating the first organic film 160 to expose the first anode connection electrode ANDE1. The second anode connection electrode ANDE2 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A second organic film 180 may be disposed on the second anode connection electrode ANDE2. The second organic film 180 may be formed of an acrylic resin, an epoxy resin, a phenolic resin, a polyamide resin, or a polyimide resin.

Although FIG. 6 illustrates an example in which the first thin film transistor TFT1 and the second thin film transistor TFT2 are formed by a top gate method in which a gate electrode is located over an active layer, the present disclosure is not limited thereto. That is, the first thin film transistor TFT1 and the second thin film transistor TFT2 may be formed by a bottom gate method in which a gate electrode is located under an active layer or a double gate method in which gate electrodes are located over and under an active layer.

Light emitting elements LEL and a bank 190 may be disposed on the second organic film 180. Each of the light emitting elements LEL includes a first light emitting electrode 171, a light emitting layer 172, and a second light emitting electrode 173.

The first light emitting electrode 171 may be formed on the second organic film 180. The first light emitting electrode 171 may be connected to the second anode connection electrode ANDE2 through a third anode contact hole ANCT3 penetrating the second organic film 180 to expose the second anode connection electrode ANDE2.

In a top emission structure in which light is emitted from the light emitting layer 172 toward the second light emitting electrode 173, the first light emitting electrode 171 may include a metal material having high reflectance such as a laminated structure of aluminum and titanium (e.g., Ti/Al/Ti), a laminated structure of aluminum and ITO (e.g., ITO/Al/ITO), an APC alloy, or a laminated structure of an APC alloy and ITO (e.g., ITO/APC/ITO). The APC alloy refers to an alloy of silver (Ag), palladium (Pd), and copper (Cu).

The bank 190 may be formed to partition the first light emitting electrode 171 on the second organic film 180 to define a light emitting area EA. The bank 190 may be formed of an acrylic resin, an epoxy resin, a phenolic resin, a polyamide resin, or a polyimide resin.

The light emitting area EA is where the first light emitting electrode 171, the light emitting layer 172, and the second light emitting electrode 173 are sequentially stacked, and holes from the first light emitting electrode 171 are combined with electrodes from the second light emitting electrode 173 to emit light.

The light emitting layer 172 is formed on the first light emitting electrode 171 and the bank 190. The light emitting layer 172 may include an organic material to emit light of a predetermined color. For example, the light emitting layer 172 may include a hole transporting layer, an organic material layer, and an electron transporting layer.

The second light emitting electrode 173 is formed on the light emitting layer 172. The second light emitting electrode 173 may be formed to cover the light emitting layer 172. The second light emitting electrode 173 may be a common layer formed in common in the entire light emitting area EA. A capping layer may be formed on the second light emitting electrode 173.

In the top emission structure, the second light emitting electrode 173 may include a transparent conductive material (TCO) such as indium tin oxide (ITO) or indium zinc oxide (IZO), which can transmit light, or a semi-transmissive conductive material such as magnesium (Mg), silver (Ag) or an alloy of magnesium (Mg) and silver (Ag). When the second light emitting electrode 173 includes a semi-transmissive conductive material, light emission efficiency may be increased by microcavities.

An encapsulation layer TFE may be formed on the second light emitting electrode 173. The encapsulation layer TFE may include at least one inorganic film to prevent the penetration of oxygen or moisture into the light emitting element layer EML. Further, the encapsulation layer TFE may include at least one organic film to protect the light emitting element layer EML from foreign matter such as dust. For example, the encapsulation layer TFE includes a first inorganic film TFE1, an organic film TFE2, and a second inorganic film TFE3.

The first inorganic film TFE1 may be disposed on the second light emitting electrode 173, the organic film TFE2 may be disposed on the first inorganic film TFE1, and the second inorganic film TFE3 may be disposed on the organic film TFE2. Each of the first inorganic film TFE1 and the second inorganic film TFE3 may be formed as a multi-layer film in which one or more inorganic layers of a silicon nitride layer, a silicon oxy nitride layer, a silicon oxide layer, a titanium oxide layer, and an aluminum oxide layer are alternately stacked. The organic film TFE2 may be formed of a monomer.

In FIG. 6, the first gate insulating film 130 may be a first insulating film, the interlayer insulating film 140 may be a second insulating film, the second gate insulating film 131 may be a third insulating film, and the insulating film 150 may be a fifth insulating film. Further, the first interlayer insulating film 141 of the interlayer insulating film 140 may be a first sub-insulating film, and the second interlayer insulating film 142 thereof may be a second sub-insulating film.

Figure 7:
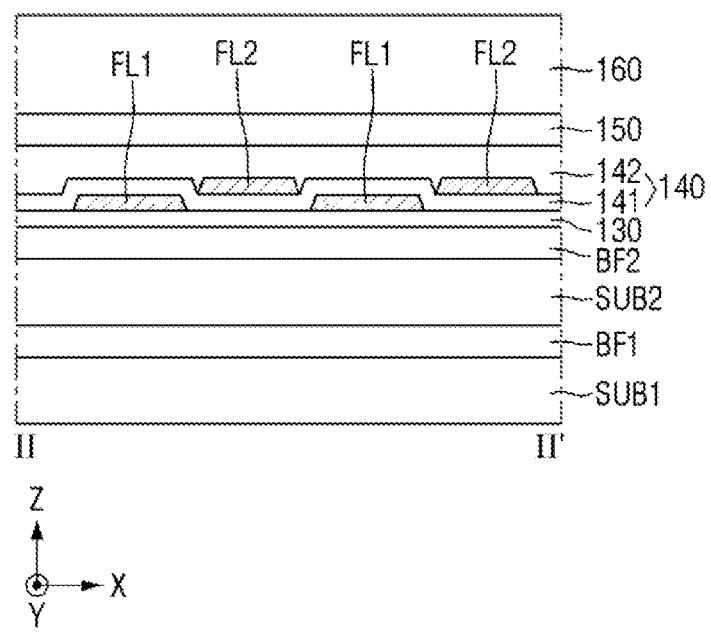
FIG. 7 is a cross-sectional view diagram illustrating an example of a display panel taken along the line II-II' of FIG. 5.

FIG. 7 shows a cross-sectional view illustrating an example of a display panel taken along the line II-II' of FIG. 5.

Referring to FIG. 7, the first fan-out lines FL1 may be arranged on the first gate insulating film 130, and the second fan-out lines FL2 may be arranged on the first interlayer insulating film 141. The first fan-out lines FL1 may be formed of the same material on the same layer as the first gate electrode G1 and the first capacitor electrode CAE1. The second fan-out lines FL2 may be formed of the same material on the same layer as the second capacitor electrode CAE2.

In this case, since the first interlayer insulating film 141 covering the first fan-out lines FL1 and the second interlayer insulating film 142 covering the second fan-out lines FL2 are in contact with each other, the stress applied to the first interlayer insulating film 141 and the second interlayer insulating film 142 may be high. Therefore, cracks may occur in at least one of the first interlayer insulating film 141 and the second interlayer insulating film 142, and thus the first fan-out lines FL1 or the second fan-out lines FL2 may be oxidized or corroded. Accordingly, the electrical connection between the data lines DL and the display driving circuit 200 may be disconnected by oxidation or corrosion of the first fan-out lines FL1 and the second fan-out lines FL2.

Figure 8:
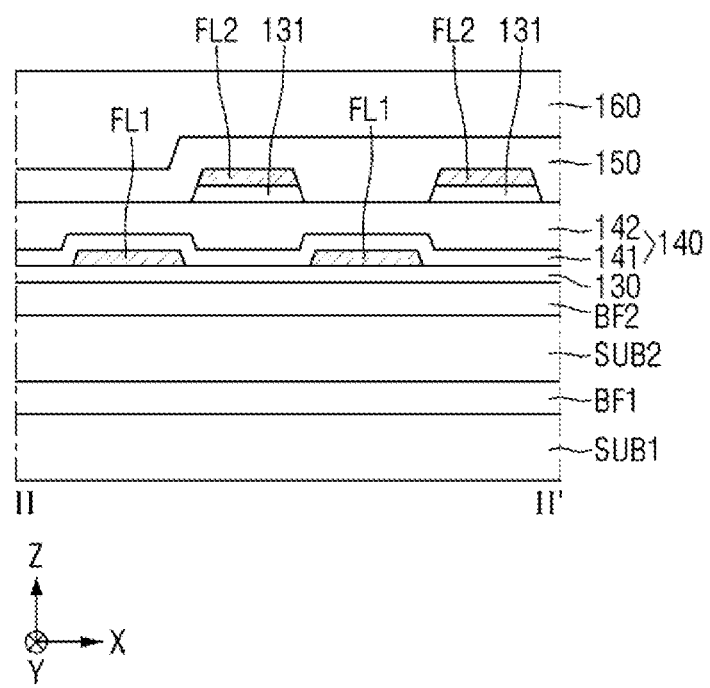
FIG. 8 is a cross-sectional view diagram illustrating another example of a display panel taken along the line II-II' of FIG. 5.

FIG. 8 shows a cross-sectional view illustrating another example of a display panel taken along the line II-II' of FIG. 5.

Referring to FIG. 8, the first fan-out lines FL1 may be arranged on the first gate insulating film 130, and the second fan-out lines FL2 may be arranged on the second gate insulating film 150. The first fan-out lines FL1 may be formed of the same material on the same layer as the first gate electrode G1 and the first capacitor electrode CAE1. The second fan-out lines FL2 may be formed of the same material on the same layer as the second capacitor electrode CAE2.

In this case, the first interlayer insulating film 141 covering the first fan-out lines FL1 and the insulating film 150 covering the second fan-out lines FL2 are not in contact with each other. A second interlayer insulating film 142 and a second gate insulating film 131 are interposed between the first interlayer insulating film 141 and the insulating film 150. Therefore, stress applied to the first interlayer insulating film 141 and the insulating film 150 may be low.

The first fan-out lines FL1 need not overlap the second fan-out lines FL2 in the third direction (Z-axis direction). The second fan-out line FL2 may be disposed between the first fan-out lines FL1 adjacent to each other in the first direction (X-axis direction).

As shown in FIG. 8, since the layer on which the first fan-out lines FL1 are arranged is away from the layer on which the second fan-out lines FL2 are arranged, the stress applied to the first interlayer insulating film 141 covering the first fan-out lines FL1 and the insulating film 150 covering the second fan-out lines FL2 may be low. Therefore, it is possible to prevent cracks from occurring in the first interlayer insulating film 141 and the insulating film 150. Accordingly, it is possible to prevent the first fan-out lines FL1 or the second fan-out lines FL2 from being oxidized or corroded by cracks of the first interlayer insulating film 141 and the insulating film 150.

Figure 9:
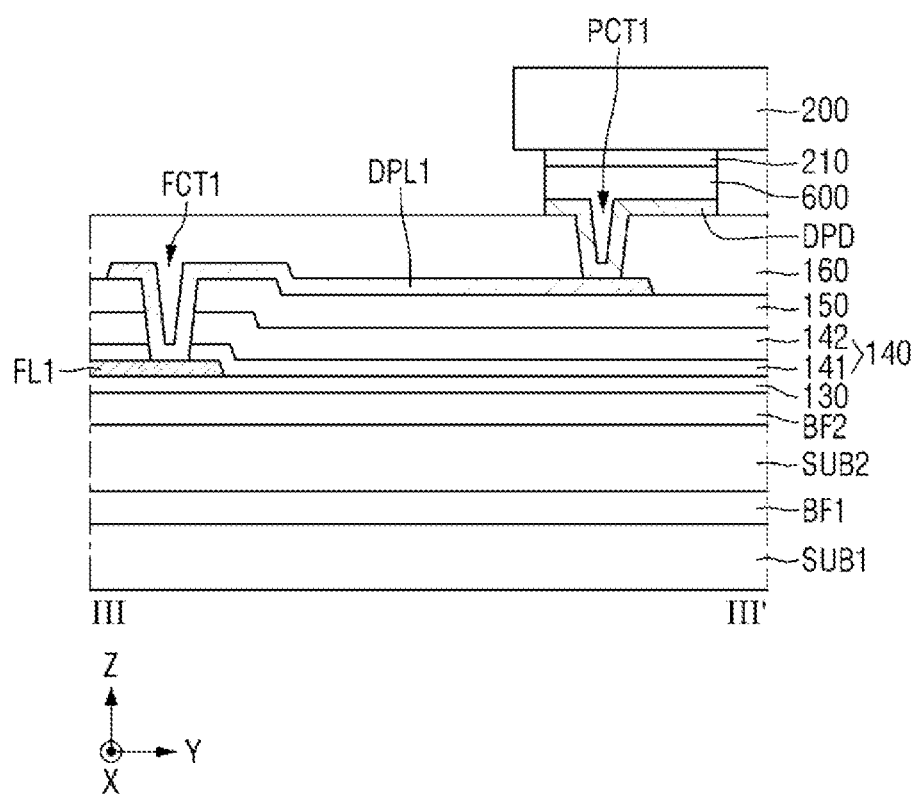
FIG. 9 is a cross-sectional view diagram illustrating an example of a display panel taken along the line III-III' of FIG. 5.
Figure 10:
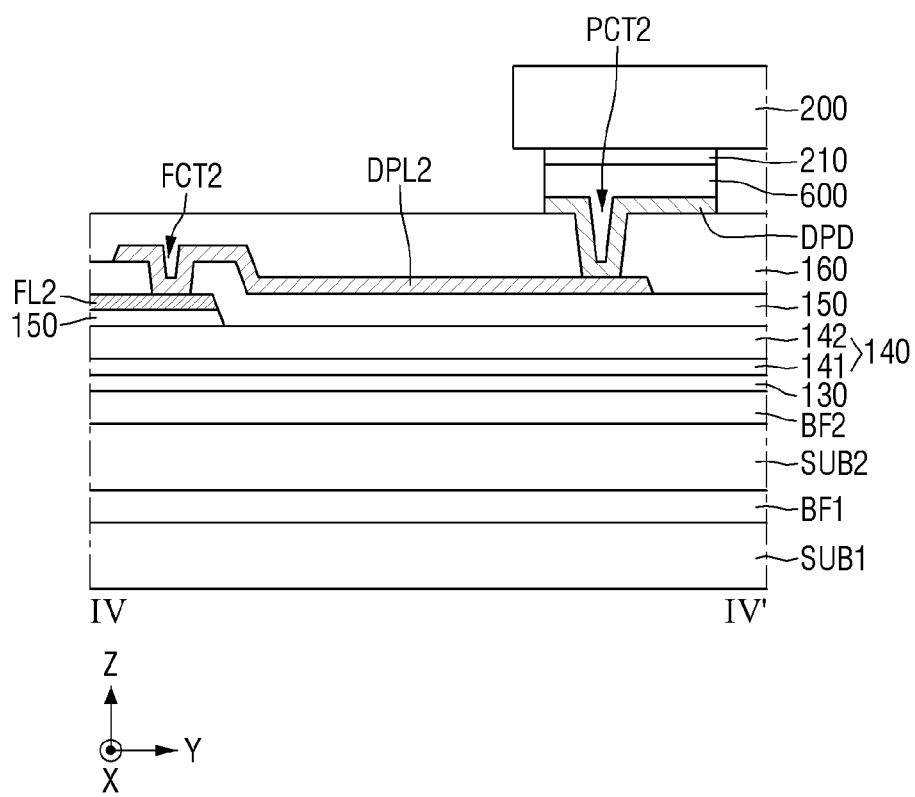
FIG. 10 is a cross-sectional view diagram illustrating an example of a display panel taken along the line IV-IV' of FIG. 5.

FIG. 9 shows a cross-sectional view illustrating an example of a display panel taken along the line III-III' of FIG. 5, and FIG. 10 shows a cross-sectional view illustrating an example of a display panel taken along the line IV-IV' of FIG. 5.

Referring to FIGS. 9 and 10, the first driving pad line DPL1 and the second driving pad line DPL2 may be disposed on the insulating film 150. The first driving pad line DPL1 and the second driving pad line DPL2 are formed of the same material on the same layer as the first anode connection electrode ANDE1, the first connection electrode BE1, and the second connection electrode BE2.

The first driving pad line DPL1 may be connected to the first fan-out line FL1 through the first fan-out contact hole FCT1 penetrating the interlayer insulating film 140 and the insulating film 150. The second driving pad line DPL2 may be connected to the second fan-out line FL2 through the second fan-out contact hole FCT2 penetrating the insulating film 150.

First driving pads DPD may be disposed on the first organic film 160. The first driving pads DPD may be formed of the same material on the same layer as the second anode connection electrode ANDE2. Any one first driving pad DPD of the first driving pads DPD may be connected to the first driving pad line DPL1 through a first pad contact hole PCT1 penetrating the first organic film 160. Another first driving pad DPD of the first driving pads DPD may be connected to the second driving pad line DPL2 through a second pad contact hole PCT2 penetrating the first organic film 160.

Bumps 210 of the display driving circuit 200 may be disposed on the first driving pads DPD. A conductive adhesive 600 may be disposed between the first driving pads DPD and the bump electrodes 210. The conductive adhesive 600 may be an anisotropic conductive film. Accordingly, the bump electrodes 210 of the display driving circuit 200 may be electrically connected one to one to the first driving pads DPD.

The second driving pads and the circuit pad lines CPL of the display driving circuit 200 may be connected to the first driving pads DPD, the first driving pad lines DPL1, and the second driving pad lines DPL2 of the display driving circuit 200, which have been described with reference to FIGS. 9 and 10, substantially in the same manner. Therefore, a description thereof may be omitted.

Figure 11:
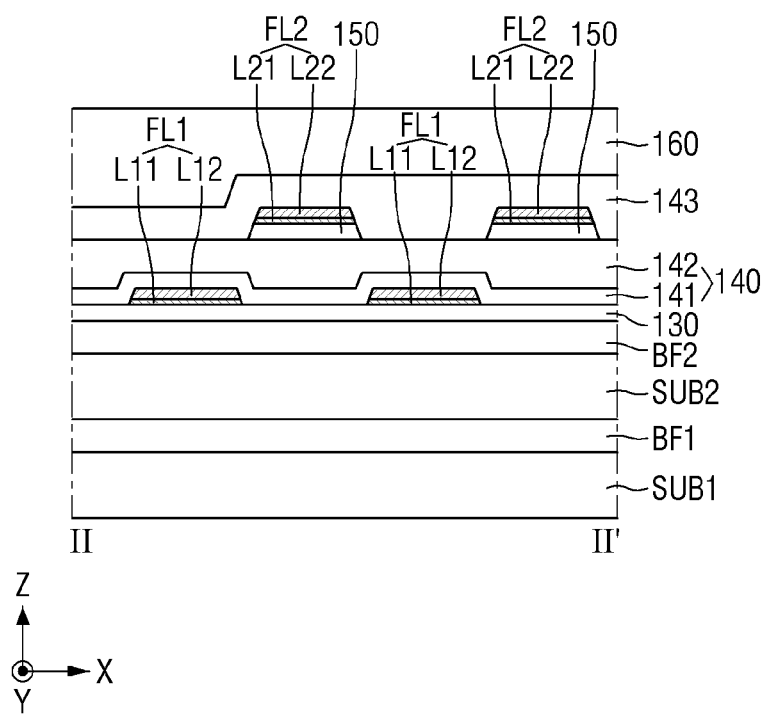
FIG. 11 is a cross-sectional view diagram illustrating another example of a display panel taken along the line II-II' of FIG. 5.

FIG. 11 shows a cross-sectional view illustrating another example of a display panel taken along the line II-II' of FIG. 5.

The embodiment of FIG. 11 is different from the embodiment of FIG. 8 in that each of the first fan-out lines FL1 includes a first metal layer L11 and a second metal layer L12, and each of the second fan-out lines FL2 includes a first metal layer L21 and a second metal layer L22. In FIG. 11, differences from the embodiment of FIG. 8 may be mainly described.

Referring to FIG. 11, each of the first fan-out lines FL1 includes a first metal layer L11 and a second metal layer L12 disposed on the first metal layer L11. The thickness of the first metal layer L11 of each of the first fan-out lines FL1 in the third direction (Z-axis direction) may be less than the thickness of the second metal layer L12 thereof in the third direction (Z-axis direction). The first metal layer L11 of each of the first fan-out lines FL1 may include titanium (Ti), and the second metal layer L12 thereof may include molybdenum (Mo), but the present disclosure is not limited thereto. The first metal layer L11 of each of the first fan-out lines FL1 may have higher corrosion resistance than the second metal layer L12.

Each of the second fan-out lines FL2 includes a first metal layer L21 and a second metal layer L22 disposed on the first metal layer L21. The thickness of the first metal layer L21 of each of the second fan-out lines FL2 in the third direction (Z-axis direction) may be less than the thickness of the second metal layer L22 thereof in the third direction (Z-axis direction). The first metal layer L21 of each of the second fan-out lines FL2 may include titanium (Ti), and the second metal layer L22 thereof may include molybdenum (Mo), but the present disclosure is not limited thereto. The second metal layer L22 of each of the second fan-out lines FL2 may have higher corrosion resistance than the first metal layer L21.

As shown in FIG. 11, each of the first fan-out lines FL1 and the second fan-out lines FL2 includes a first metal layer L11/L21 having high corrosion resistance. Thus, even if the second metal layer L12/L22 of each of the first fan-out lines FL1 and the second fan-out lines FL2 is oxidized or corroded, the first metal layer L11/L21 need not be oxidized or corroded. Accordingly, it is possible to prevent the electrical connection between the data line DL and the display driving circuit 200 from being disconnected by oxidation or corrosion of the second metal layer L12 of the first fan-out line FL1 or the second metal layer L22 of the second fan-out line FL2.

Figure 12A:
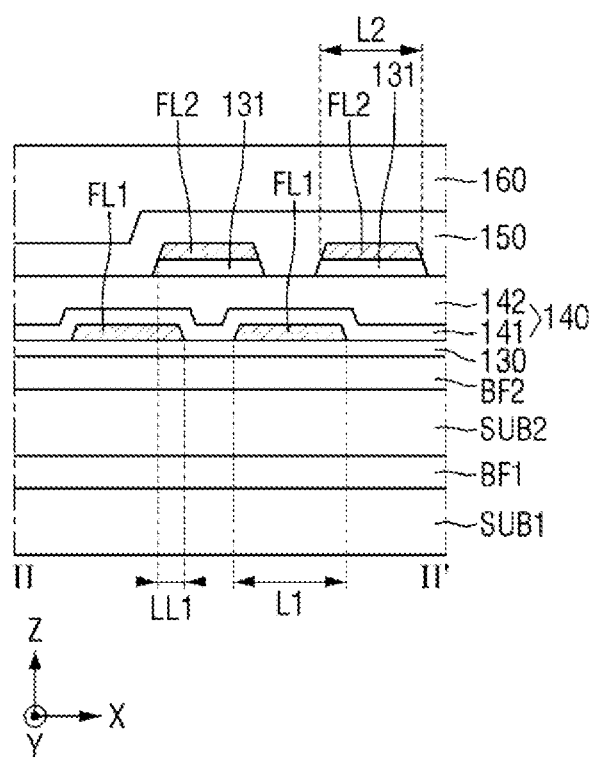
FIGS. 12A and 12B are cross-sectional view diagrams illustrating other examples of a display panel taken along the line II-II' of FIG. 5.
Figure 12B:
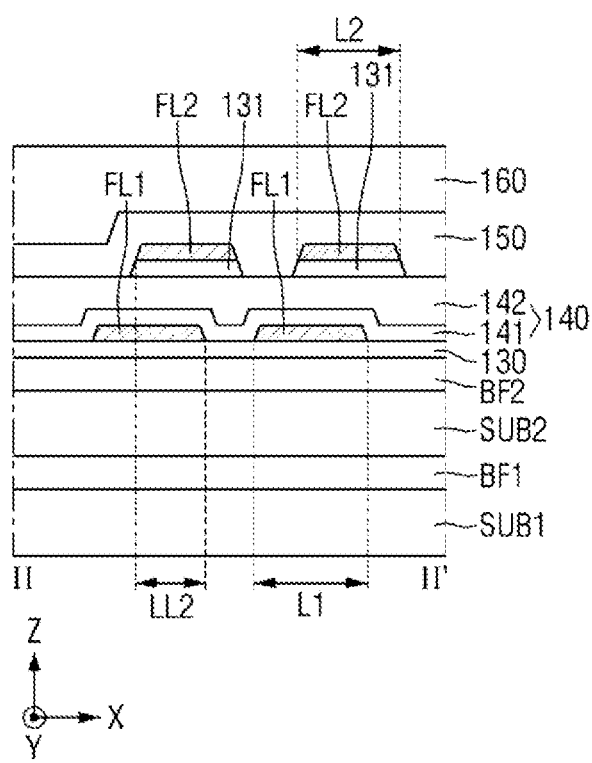

FIGS. 12A and 12B show cross-sectional views illustrating other examples of a display panel taken along the line II-II' of FIG. 5.

The embodiment of FIGS. 12A and 12B is different from the embodiment of FIG. 8 in that the first fan-out lines FL1 overlap the second fan-out lines FL2 in the third direction (Z-axis direction). In FIGS. 12A and 12B, differences from the embodiment of FIG. 8 may be mainly described.

Referring to FIGS. 12A and 12B, the first fan-out line FL1 may overlap at least one second fan-out line FL2 in the third direction (Z-axis direction). The second fan-out line FL2 may overlap at least one first fan-out line FL1 in the third direction (Z-axis direction).

As shown in FIG. 12A, the length LL1 of the first direction (X-axis direction) in which the first fan-out line FL1 overlaps the second fan-out line FL2 in the third direction (Z-axis direction) may be less than ½ of the length L1 of the first fan-out line FL1 in the first direction (X-axis direction). Further, the length LL1 of the first direction (X-axis direction) in which the first fan-out line FL1 overlaps the second fan-out line FL2 in the third direction (Z-axis direction) may be less than ½ of the length L2 of the second fan-out line FL2 in the first direction (X-axis direction). In this case, the first fan-out line FL1 may overlap the two second fan-out lines FL2 in the third direction (Z-axis direction). Further, the second fan-out line FL2 may overlap the two first fan-out lines FL1 in the third direction (Z-axis direction).

Alternatively, as shown in FIG. 12B, the length LL2 of the first direction (X-axis direction) in which the first fan-out line FL1 overlaps the second fan-out line FL2 in the third direction (Z-axis direction) may be greater than ½ of the length L1 of the first fan-out line FL1 in the first direction (X-axis direction). Further, the length LL2 of the first direction (X-axis direction) in which the first fan-out line FL1 overlaps the second fan-out line FL2 in the third direction (Z-axis direction) may be greater than ½ of the length L2 of the second fan-out line FL2 in the first direction (X-axis direction). In this case, the first fan-out line FL1 may overlap the two second fan-out lines FL2 in the third direction (Z-axis direction). Further, the second fan-out line FL2 may overlap the two first fan-out lines FL1 in the third direction (Z-axis direction).

As shown in FIGS. 12A and 12B, when the first fan-out lines FL1 overlap the second fan-out lines FL2 in the third direction (Z-axis direction), the length of the first direction (X-axis direction) of the area in which the first fan-out lines FL1 and the second fan-out lines FL2 are arranged may be reduced. Therefore, the space in which the fan-out lines FL are arranged in the sub-area SBA and the non-display area NDA of the main area MA may be reduced, so that degree of freedom of line design in the display panel 100 may be increased.

Figure 13:
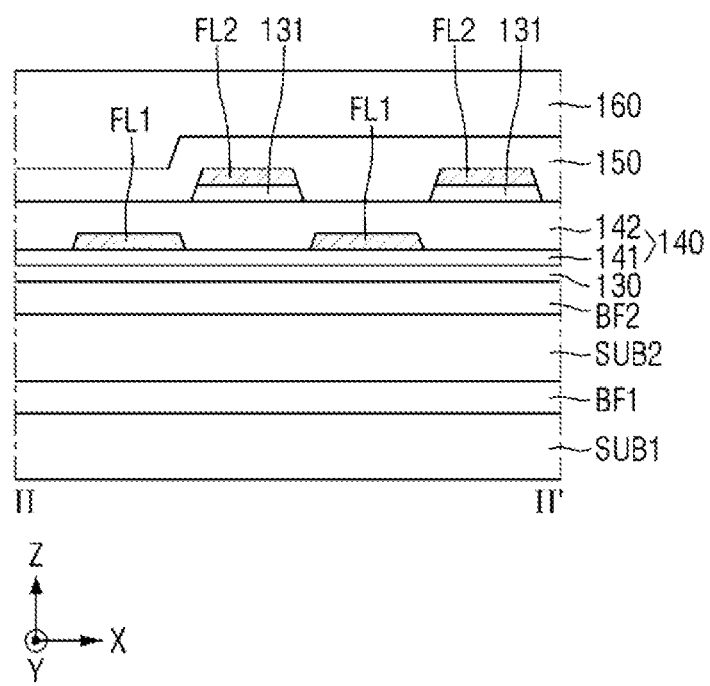
FIG. 13 is a cross-sectional view diagram illustrating another example of a display panel taken along the line II-II' of FIG. 5.

FIG. 13 shows a cross-sectional view illustrating another example of a display panel taken along the line II-II' of FIG. 5.

The embodiment of FIG. 13 is different from the embodiment of FIG. 8 in that the first fan-out lines FL1 are arranged on the first interlayer insulating film 141. In FIG. 13, differences from the embodiment of FIG. 8 may be mainly described.

Referring to FIG. 13, the first fan-out lines FL1 may be formed of the same material on the same layer as the second capacitor electrode CAE2. In this case, a second gate insulating film 131 is partially interposed between the second interlayer insulating film 142 covering the first fan-out lines FL1 and the insulating film 150 covering the second fan-out lines FL2. Therefore, stress applied to the second interlayer insulating film 142 and the insulating film 150 may be low.

As shown in FIG. 13, since an insulating film is partially disposed between the layer on which the first fan-out lines FL1 are arranged and the layer on which the second fan-out lines FL2 are arranged, the stress applied to the first interlayer insulating film 141 covering the first fan-out lines FL1 and the insulating film 150 covering the second fan-out lines FL2 may be low. Therefore, it is possible to prevent cracks from occurring in the second interlayer insulating film 142 and the insulating film 150. Accordingly, it is possible to prevent the first fan-out lines FL1 or the second fan-out lines FL2 from being oxidized or corroded by cracks of the second interlayer insulating film 142 and the insulating film 150.

Figure 14A:
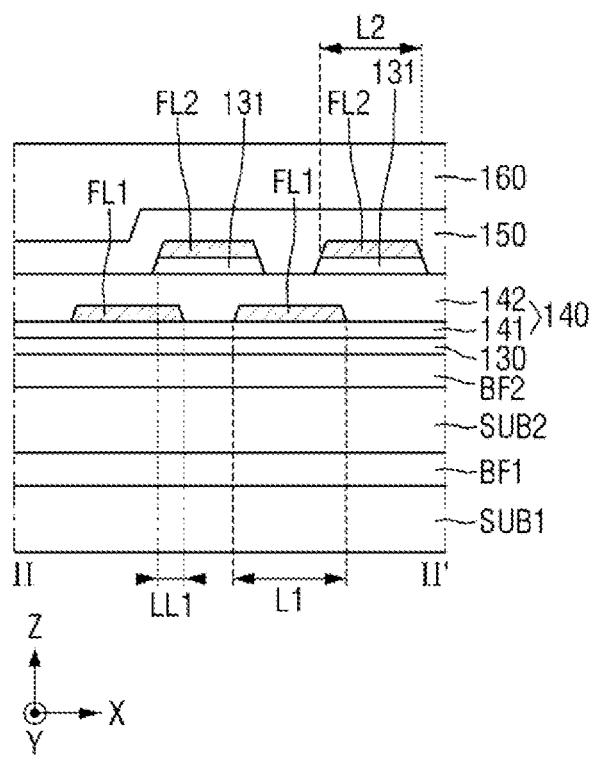
FIGS. 14A and 14B are cross-sectional view diagrams illustrating other examples of a display panel taken along the line II-II' of FIG. 5.
Figure 14B:
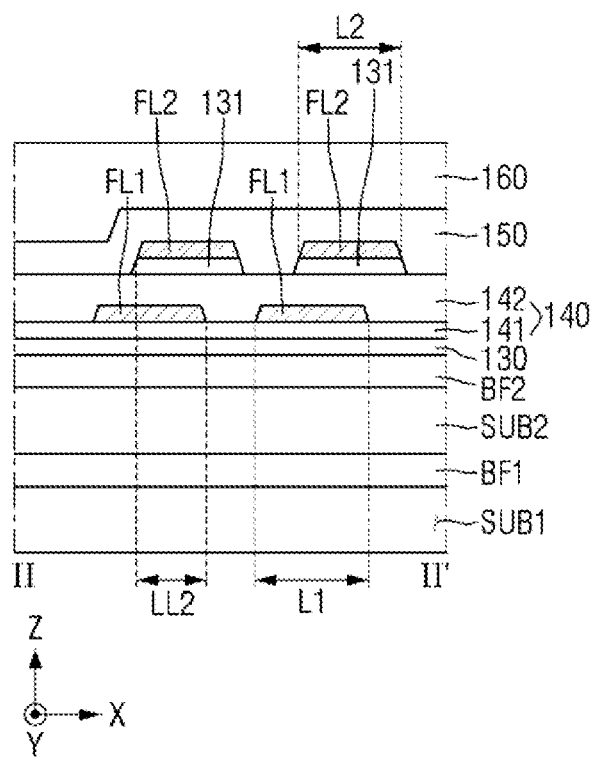

FIGS. 14A and 14B show cross-sectional views illustrating other examples of a display panel taken along the line II-II' of FIG. 5.

The embodiment of FIGS. 14A and 14B is different from the embodiment of FIG. 13 in that the first fan-out lines FL1 overlap the second fan-out lines FL2 in the third direction (Z-axis direction). In FIGS. 14A and 14B, differences from the embodiment of FIG. 13 may be mainly described.

Referring to FIGS. 14A and 14B, the first fan-out line FL1 may overlap at least one second fan-out line FL2 in the third direction (Z-axis direction). The second fan-out line FL2 may overlap at least one first fan-out line FL1 in the third direction (Z-axis direction).

As shown in FIG. 14A, the length LL1 of the first direction (X-axis direction) in which the first fan-out line FL1 overlaps the second fan-out line FL2 in the third direction (Z-axis direction) may be less than ½ of the length L1 of the first fan-out line FL1 in the first direction (X-axis direction). Further, the length LL1 of the first direction (X-axis direction) in which the first fan-out line FL1 overlaps the second fan-out line FL2 in the third direction (Z-axis direction) may be less than ½ of the length L2 of the second fan-out line FL2 in the first direction (X-axis direction). In this case, the first fan-out line FL1 may overlap the two second fan-out lines FL2 in the third direction (Z-axis direction). Further, the second fan-out line FL2 may overlap the two first fan-out lines FL1 in the third direction (Z-axis direction).

Alternatively, as shown in FIG. 14B, the length LL2 of the first direction (X-axis direction) in which the first fan-out line FL1 overlaps the second fan-out line FL2 in the third direction (Z-axis direction) may be greater than ½ of the length L1 of the first fan-out line FL1 in the first direction (X-axis direction). Further, the length LL2 of the first direction (X-axis direction) in which the first fan-out line FL1 overlaps the second fan-out line FL2 in the third direction (Z-axis direction) may be greater than ½ of the length L2 of the second fan-out line FL2 in the first direction (X-axis direction). In this case, the first fan-out line FL1 may overlap the two second fan-out lines FL2 in the third direction (Z-axis direction). Further, the second fan-out line FL2 may overlap the two first fan-out lines FL1 in the third direction (Z-axis direction).

As shown in FIGS. 14A and 14B, when the first fan-out lines FL1 overlap the second fan-out lines FL2 in the third direction (Z-axis direction), the length of the first direction (X-axis direction) of the area in which the first fan-out lines FL1 and the second fan-out lines FL2 are arranged may be reduced. Therefore, the space in which the fan-out lines FL are arranged in the sub-area SBA and the non-display area NDA of the main area MA may be reduced, so that degree of freedom of line design in the display panel 100 may be increased.

Figure 15:
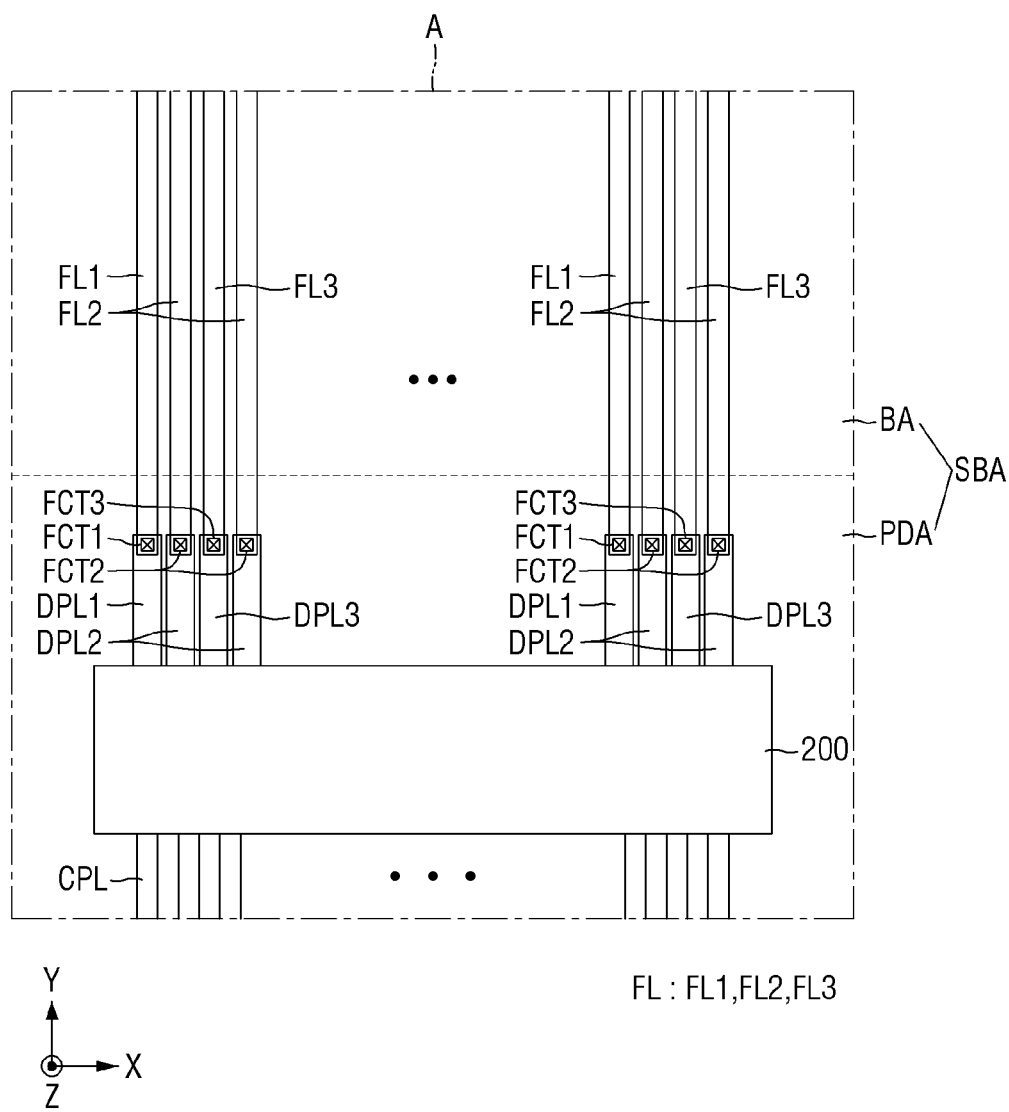
FIG. 15 is a layout view diagram specifically illustrating another example of the fan-out lines of FIG. 3.

FIG. 15 shows a layout view specifically illustrating another example of the fan-out lines of FIG. 3.

The embodiment of FIG. 15 is different from the embodiment of FIG. 5 in that the fan-out lines FL further include third fan-out lines FL3. In FIG. 15, differences from the embodiment of FIG. 5 may be mainly described.

Referring to FIG. 15, the first fan-out lines FL1, the second fan-out lines FL2, and the third fan-out lines FL3 may be repeatedly arranged in the first direction (X-axis direction) in order of the first fan-out line FL1, the second fan-out line FL2, the third fan-out line FL3, and the second fan-out line FL2.

That is, the first fan-out lines FL1 may alternate with the third fan-out lines FL3 in the first direction, without limitation thereto. Moreover, the first fan-out lines FL1 and the third fan-out lines FL3 may be disposed substantially between adjacent second fan-out lines FL2 in the first direction.

In an alternate embodiment, the second fan-out lines FL2 may alternate with the third fan-out lines FL3 in the first direction, without limitation thereto. Moreover, the second fan-out lines FL2 and the third fan-out lines FL3 may be disposed substantially between adjacent first fan-out lines FL1 in the first direction.

In another alternate embodiment, the first fan-out lines FL1 may alternate with the second fan-out lines FL2 in the first direction, without limitation thereto. Moreover, the first fan-out lines FL1 and the second fan-out lines FL2 may be disposed substantially between adjacent third fan-out lines FL3 in the first direction.

In yet another alternate embodiment, the first fan-out lines FL1, the second fan-out lines FL2, and the third fan-out lines may alternate in that repeating order in the first direction, without limitation thereto. Moreover, each of the first fan-out lines FL1, the second fan-out lines FL2, and the third fan-out lines FL3 may be disposed substantially between adjacent ones of the other two of the fan-out lines FL1, FL2, and FL3 in the first direction.

The driving pad lines DPL may additionally include third driving pad lines DPL3. The first driving pad lines DPL1, the second driving pad lines DPL2, and the third driving pad lines DPL3 may be repeatedly arranged in the first direction (X-axis direction) in order of the first driving pad line DPL1, the second driving pad line DPL2, the third driving pad line DPL3, and the second driving pad line DPL2.

The third driving pad lines DPL3 may be connected one-to-one to the third fan-out lines FL3. Each of the third driving pad lines DPL3 may be connected to the third fan-out line FL3 through a third fan-out contact hole FCT3.

The third driving pad lines DPL3 may be connected to the first driving pads disposed under the display driving circuit 200. For example, since the first bump electrodes of the display driving circuit 200 are connected to the first driving pads by a conductive adhesive such as an anisotropic conductive film, the third driving pad lines DPL3 may be electrically connected to the first bump electrodes of the display driving circuit 200.

Figure 16:
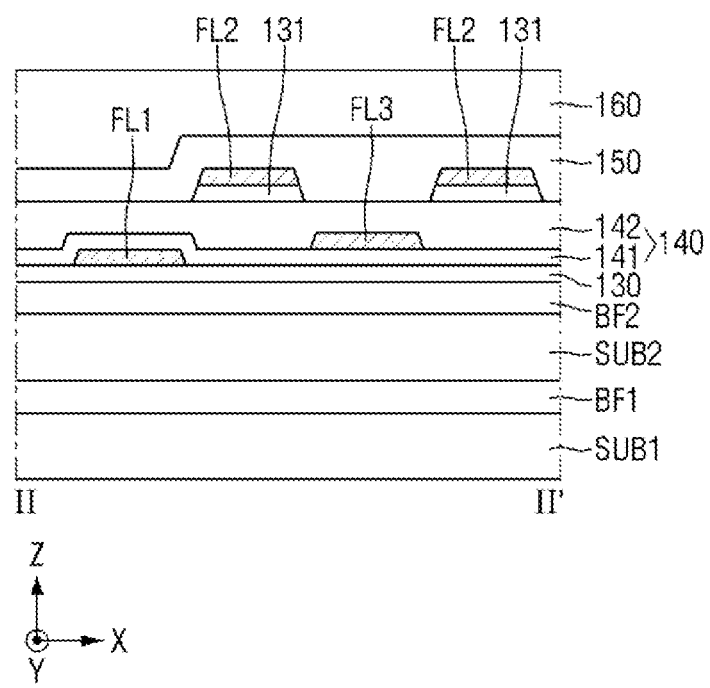
FIG. 16 is a cross-sectional view diagram illustrating an example of a display panel taken along the line V-V' of FIG. 15.

FIG. 16 shows a cross-sectional view illustrating an example of a display panel taken along the line V-V' of FIG. 15.

The embodiment of FIG. 16 is different from the embodiment of FIG. 8 in that third fan-out lines FL3 are arranged on the first interlayer insulating film 141. In FIG. 16, the differences from the embodiment of FIG. 8 may be mainly described.

Referring to FIG. 16, the third fan-out lines FL3 may be formed of the same material on the same layer as the second capacitor electrode CAE2. In this case, a second gate insulating film 131 is partially interposed between the second interlayer insulating film 142 covering the third fan-out lines FL3 and the insulating film 150 covering the second fan-out lines FL2. Further, the interval between the first fan-out line FL1 disposed on the first gate insulating film 130 and the third fan-out line FL3 disposed on the first interlayer insulating film 141 may be increased. Therefore, stress applied to the first interlayer insulating film 141, the second interlayer insulating film 142, and the insulating film 150 may be low.

As shown in FIG. 16, when an insulating film is partially disposed between the layer on which the second fan-out lines FL2 are arranged and the layer on which the third fan-out lines FL3 are arranged and the interval between the first fan-out line FL1 and the second fan-out line FL2 is increased, the stress applied to the first interlayer insulating film 141 covering the first fan-out lines FL1, the insulating film 150 covering the second fan-out lines FL2, and the second interlayer insulating film 142 covering the third fan-out lines FL3 may be low. Therefore, it is possible to prevent cracks from occurring in the first interlayer insulating film 141, the second interlayer insulating film 142 and the insulating film 150. Accordingly, it is possible to prevent the first fan-out lines FL1, the second fan-out lines FL2, or the third fan-out lines FL3 from being oxidized or corroded by cracks of the first interlayer insulating film 141, the second interlayer insulating film 142, and the insulating film 150.

Figure 17A:
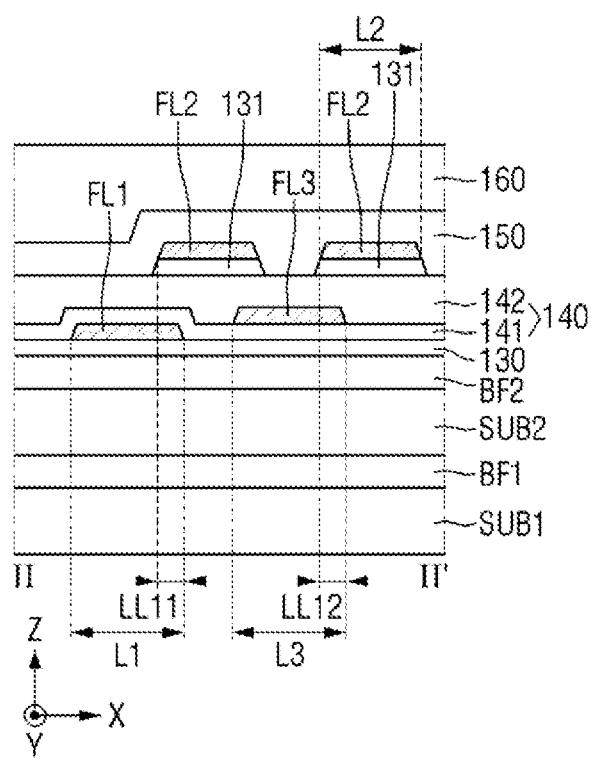
FIGS. 17A and 17B are cross-sectional view diagrams illustrating other examples of a display panel taken along the line V-V' of FIG. 15.
Figure 17B:
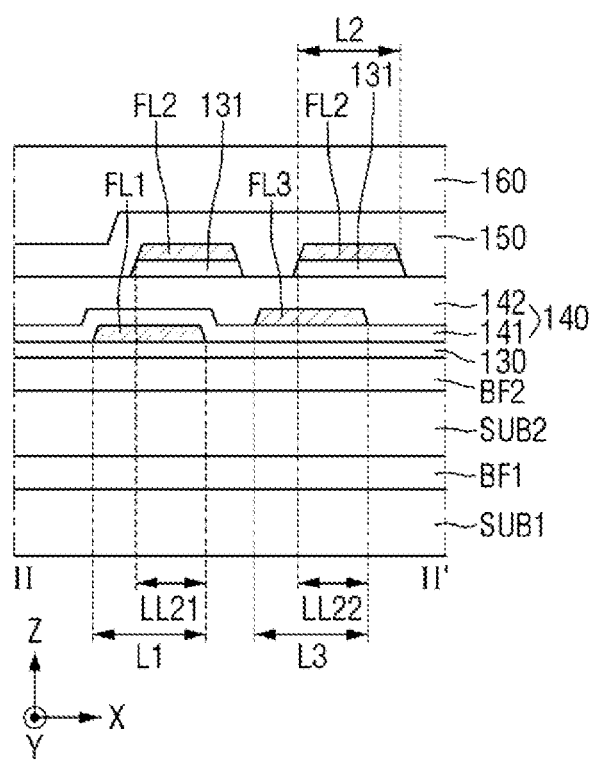

FIGS. 17A and 17B show cross-sectional views illustrating other examples of a display panel taken along the line V-V' of FIG. 15.

The embodiment of FIGS. 17A and 17B is different from the embodiment of FIG. 16 in that the first fan-out lines FL1 overlap the second fan-out lines FL2 in the third direction (Z-axis direction), and the second fan-out lines FL2 overlap the third fan-out lines FL3 in the third direction (Z-axis direction). In FIGS. 17A and 17B, differences from the embodiment of FIG. 16 may be mainly described.

Referring to FIGS. 17A and 17B, the first fan-out line FL1 may overlap at least one second fan-out line FL2 in the third direction (Z-axis direction). The third fan-out line FL3 may overlap at least one second fan-out line FL2 in the third direction (Z-axis direction). The second fan-out line FL2 may overlap at least one first fan-out line FL1 in the third direction (Z-axis direction). Alternatively, the second fan-out line FL2 may overlap at least one third fan-out line FL3 in the third direction (Z-axis direction).

As shown in FIG. 17A, the length LL11 of the first direction (X-axis direction) in which the first fan-out line FL1 overlaps the second fan-out line FL2 in the third direction (Z-axis direction) may be less than ½ of the length L1 of the first fan-out line FL1 in the first direction (X-axis direction). Further, the length LL11 of the first direction (X-axis direction) in which the first fan-out line FL1 overlaps the second fan-out line FL2 in the third direction (Z-axis direction) may be less than ½ of the length L2 of the second fan-out line FL2 in the first direction (X-axis direction).

Further, the length LL12 of the first direction (X-axis direction) in which the third fan-out line FL3 overlaps the second fan-out line FL2 in the third direction (Z-axis direction) may be less than ½ of the length L3 of the third fan-out line FL3 in the first direction (X-axis direction). Further, the length LL12 of the first direction (X-axis direction) in which the third fan-out line FL3 overlaps the second fan-out line FL2 in the third direction (Z-axis direction) may be less than ½ of the length L2 of the second fan-out line FL2 in the first direction (X-axis direction).

In this case, the second fan-out line FL2 may overlap the first fan-out line FL1 and the third fan-out line FL3 in the third direction (Z-axis direction). The length LL11 of the first direction (X-axis direction) in which the first fan-out line FL1 overlaps the second fan-out line FL2 in the third direction (Z-axis direction) may be substantially the same as the length LL12 of the first direction (X-axis direction) in which the third fan-out line FL3 overlaps the second fan-out line FL2 in the third direction (Z-axis direction), but the present disclosure is not limited thereto, and the length LL11 may be different from the length LL12.

Alternatively, as shown in FIG. 17B, the length LL21 of the first direction (X-axis direction) in which the first fan-out line FL1 overlaps the second fan-out line FL2 in the third direction (Z-axis direction) may be greater than ½ of the length L1 of the first fan-out line FL1 in the first direction (X-axis direction). Further, the length LL21 of the first direction (X-axis direction) in which the first fan-out line FL1 overlaps the second fan-out line FL2 in the third direction (Z-axis direction) may be greater than ½ of the length L2 of the second fan-out line FL2 in the first direction (X-axis direction).

Further, the length LL22 of the first direction (X-axis direction) in which the third fan-out line FL3 overlaps the second fan-out line FL2 in the third direction (Z-axis direction) may be greater than ½ of the length L3 of the third fan-out line FL3 in the first direction (X-axis direction). Further, the length LL22 of the first direction (X-axis direction) in which the third fan-out line FL3 overlaps the second fan-out line FL2 in the third direction (Z-axis direction) may be greater than ½ of the length L2 of the second fan-out line FL2 in the first direction (X-axis direction).

In this case, the second fan-out line FL2 may overlap one first fan-out line FL1 or one third fan-out line FL3 in the third direction (Z-axis direction). The length LL21 of the first direction (X-axis direction) in which the first fan-out line FL1 overlaps the second fan-out line FL2 in the third direction (Z-axis direction) may be substantially the same as the length LL22 of the first direction (X-axis direction) in which the third fan-out line FL3 overlaps the second fan-out line FL2 in the third direction (Z-axis direction), but the present disclosure is not limited thereto, and the length LL21 may be different from the length LL22.

As shown in FIGS. 17A and 17B, when the first fan-out lines FL1 overlap the second fan-out lines FL2 in the third direction (Z-axis direction) and the second fan-out lines FL2 overlap the third fan-out lines FL3 in the third direction (Z-axis direction), the length of the first direction (X-axis direction) of the area in which the first fan-out lines FL1, the second fan-out lines FL2, and the third fan-out lines FL3 are arranged may be reduced. Therefore, the space in which the fan-out lines FL are arranged in the sub-area SBA and the non-display area NDA of the main area MA may be reduced, so that degree of freedom of line design in the display panel 100 may be increased.

In an alternate embodiment, rather than the maximum overlap distance in the X-axis direction being based on a fixed fraction of the fan-out line width in the X-axis direction, the overlap distance may be alternatively and/or additionally based on a distance between the overlapping fan-out lines in at least the Z-axis direction, with greater Z-axis distance allowing for greater X-axis overlap. Such distance may be a spatial distance in the Z-axis direction, an impedance distance through a substantially isotropic insulating layer, or an impedance distance through an anisotropic insulating layer having a high impedance per unit distance in the Z-axis direction.

In a display device according to an exemplary embodiment of the present disclosure, since a layer on which first fan-out lines are arranged is apart from a layer on which second fan-out lines are arranged, stress applied to a first interlayer insulating film covering the first fan-out lines and an insulating film covering the second fan-out lines may be low. Therefore, it is possible to prevent cracks from occurring in the first interlayer insulating film covering the first fan-out lines and the insulating film covering the second fan-out lines. Accordingly, it is possible to prevent the first fan-out lines or the second fan-out lines from being oxidized or corroded by cracks of the first interlayer insulating film covering the first fan-out lines and the insulating film covering the second fan-out lines.

In a display device according to an exemplary embodiment of the present disclosure, when the first fan-out lines overlap the second fan-out lines, an area in which the first fan-out lines and the second fan-out lines are arranged may be reduced. Therefore, a space in which the fan-out lines are arranged may be reduced, so that degrees of freedom for line design in a display panel may be increased.

While the present disclosure has been particularly shown and described with reference to the exemplary embodiments thereof, it shall be understood by those of ordinary skill in the pertinent art that various changes in form and detail may be made thereto without departing from the spirit and scope of the present disclosure as set forth in the following claims.

What is claimed is:

1. A display device, comprising:
    a substrate including a bending area;
    sub-pixels disposed on the substrate;
    data lines disposed on the substrate and connected to the sub-pixels;
    a display driving circuit disposed on the substrate and supplying data voltages to the data lines; and
    fan-out lines disposed on the substrate and connecting the data lines with the display driving circuit through the bending area,
    wherein each of the sub-pixels includes a first transistor having a first active layer disposed on the substrate as well as a first gate electrode disposed on the first active layer, and a second transistor having a second active layer disposed on the substrate as well as a second gate electrode disposed on the second active layer, the second active layer being disposed between the first gate electrode and the second gate electrode,
    wherein the fan-out lines include first fan-out lines and second fan-out lines alternately arranged with each other in one direction through the bending area,
    wherein the first fan-out lines are arranged on the same layer as the first gate electrode, and the second fan-out lines are arranged on the same layer as the second gate electrode,
    wherein at least two insulating films are disposed in the bending area between the first fan-out lines and the second fan-out lines,
    wherein the at least two insulating films comprise a first insulating film including insulating patterns in contact with the second fan-out lines, and
    wherein side surfaces of the insulating patterns align with side surfaces of the second fan-out lines.

2. The display device of claim 1,
    wherein the first fan-out lines do not overlap the second fan-out lines in a thickness direction of the substrate through the bending area.

3. The display device of claim 1,
    wherein each of the first fan-out lines and the second fan-out lines includes a first metal layer and a second metal layer disposed on the first metal layer.

4. The display device of claim 3,
    wherein the first metal layer is thinner than the second metal layer.

5. The display device of claim 1,
    wherein, among the first fan-out lines and the second fan-out lines, each first fan-out line and second fan-out line adjacent to each other overlap each other in a thickness direction of the substrate through the bending area.

6. The display device of claim 1, further comprising third fan-out lines alternately arranged with the second fan-out lines in the one direction through the bending area, and disposed in a layer between the first fan-out lines and the second fan-out lines in a thickness direction of the substrate through the bending area,
    wherein each of the sub-pixels includes a silicon semiconductor disposed on the first active layer and an oxide semiconductor disposed on the second active layer.

7. A display device, comprising:
    a substrate including a bending area;
    a first active layer disposed on the substrate;
    a first insulating film disposed on the first active layer;

a first gate electrode and first fan-out lines arranged on the first insulating film;
a second insulating film disposed on the first gate electrode and the first fan-out lines;
a second active layer disposed on the second insulating film;
a third insulating film disposed on the second active layer;
a second gate electrode and second fan-out lines arranged on the third insulating film; and
a fourth insulating film disposed on the second gate electrode and the second fan-out lines,
wherein the second active layer is disposed between the first gate electrode and the second gate electrode,
wherein the first, second and third insulating films are disposed in the bending area between the first fan-out lines and the second fan-out lines,
wherein the third insulating film includes insulating patterns in contact with the second fan-out lines, and
wherein side surfaces of the insulating patterns align with side surfaces of the second fan-out lines.

8. The display device of claim 7,
wherein the first fan-out lines and the second fan-out lines are alternately arranged each other in one direction through the bending area.

9. The display device of claim 7,
wherein the first fan-out lines do not overlap the second fan-out lines in a thickness direction of the substrate through the bending area.

10. The display device of claim 7,
wherein each of the first fan-out lines and the second fan-out lines includes a first metal layer and a second metal layer disposed on the first metal layer.

11. The display device of claim 10,
wherein the first metal layer is thinner than the second metal layer.

12. The display device of claim 9,
wherein, among the first fan-out lines and the second fan-out lines, the first fan-out line and second fan-out line adjacent to each other overlap each other in a thickness direction of the substrate through the bending area.

13. The display device of claim 7,
wherein the second insulating film includes a first sub-insulating film and a second sub-insulating film, and
the display device further includes third fan-out lines disposed on the first subs insulating film and covered by the second sub-insulating film.

14. The display device of claim 13,
wherein the first fan-out lines, the second fan-out lines, and third fan-out lines are arranged in order of the first fan-out line, the second fan-out line, third fan-out line, and the second fan-out line.

15. The display device of claim 13,
wherein the first fan-out lines, the second fan-out lines, and third fan-out lines do not overlap each other in a thickness direction of the substrate through the bending area.

16. The display device of claim 13,
wherein, among the first fan-out lines and the second fan-out lines, the first fan-out line and second fan-out line adjacent to each other overlap each other in a thickness direction of the substrate through the bending area, and
among the second fan-out lines and the third fan-out lines, the second fan-out line and third fan-out line adjacent to each other overlap each other in the thickness direction of the substrate through the bending area.

17. The display device of claim 7, further comprising:
a first driving pad line disposed on the fourth insulating film and connected to any one of the first fan-out lines through a first fan-out contact hole penetrating the second insulating film and the fourth insulating film; and
a second driving pad line disposed on the fourth insulating film and connected to any one of the second fan-out lines through a second fan-out contact hole penetrating the fourth insulating film.

18. The display device of claim 16, further comprising:
a first organic film disposed on the first driving pad line and the second driving pad line; and
a first driving pad connected to the first driving pad line through a first pad contact hole penetrating the first organic film.

19. The display device of claim 18, further comprising:
a display driving circuit including a first bump electrically connected to the first driving pad.

20. The display device of claim 19, further comprising:
a conductive adhesive disposed between the first driving pad and the first bump.

21. The display device of claim 7, further comprising third fan-out lines alternately arranged with at least one of the first fan-out lines or the second fan-out lines in one direction through the bending area, and disposed in a layer between the first fan-out lines and the second fan-out lines in a thickness direction of the substrate through the bending area,
wherein the first active layer includes a silicon semiconductor, and the second active layer includes an oxide semiconductor.

22. A display device, comprising:
a substrate including a bending area;
a first active layer disposed on the substrate;
a first insulating film disposed on the first active layer;
a first gate electrode disposed on the first insulating film;
a first sub-insulating film of a second insulating film disposed on the first gate electrode;
first fan-out lines arranged on the first sub-insulating film;
a second sub-insulating film of the second insulating film disposed on the first fan-out lines;
a second active layer disposed on the second sub-insulating film;
a third insulating film disposed on the second active layer;
a second gate electrode and second fan-out lines arranged on the third insulating film; and
a fourth insulating film disposed on the second gate electrode and the second fan-out lines,
wherein the second active layer is disposed between the first gate electrode and the second gate electrode,
wherein the first, second and third insulating films are disposed in the bending area between the first fan-out lines and the second fan-out lines,
wherein the third insulating film includes insulating patterns in contact with the second fan-out lines, and
wherein side surfaces of the insulating patterns align with side surfaces of the second fan-out lines.

23. The display device of claim 22, further comprising third fan-out lines alternately arranged with at least one of the second fan-out lines or the first fan-out lines in one direction through the bending area, and disposed on the second sub-insulating film,
wherein at least one of the first active layer or the second active layer includes a silicon semiconductor, and at least the other of the first active layer or the second active layer includes an oxide semiconductor.

* * * * *